US010628053B2

(12) United States Patent
Spanier et al.

(10) Patent No.: US 10,628,053 B2
(45) Date of Patent: Apr. 21, 2020

(54) INTELLIGENT ELECTRONIC DEVICE FOR RECEIVING AND SENDING DATA AT HIGH SPEEDS OVER A NETWORK

(71) Applicant: Electro Industries/Gauge Tech, Westbury, NY (US)

(72) Inventors: Joseph Spanier, Brooklyn, NY (US); Wei Wang, Mahwah, NJ (US); Dulciane Siqueira da Silva, Recife-Pernambuco (BR)

(73) Assignee: Electro Industries/Gauge Tech, Westbury, NY (US)

(*) Notice: Subject to any disclaimer, the term of this patent is extended or adjusted under 35 U.S.C. 154(b) by 0 days.

(21) Appl. No.: 14/797,279

(22) Filed: Jul. 13, 2015

(65) Prior Publication Data

US 2016/0011797 A1  Jan. 14, 2016

Related U.S. Application Data

(63) Continuation of application No. 12/061,979, filed on Apr. 3, 2008, now Pat. No. 9,080,894, which is a (Continued)

(51) Int. Cl.
G06F 3/06 (2006.01)
G06F 16/27 (2019.01)
(Continued)

(52) U.S. Cl.
CPC .......... *G06F 3/0613* (2013.01); *G01D 4/004* (2013.01); *G06F 3/0619* (2013.01);
(Continued)

(58) Field of Classification Search
CPC ...... G01R 22/063; G06Q 50/06; G01D 4/004; H04L 63/029; H04L 67/04; H04L 67/06
See application file for complete search history.

(56) References Cited

U.S. PATENT DOCUMENTS 1,863,741 A  6/1932 Leon
2,292,163 A  8/1942 Shea
(Continued)

FOREIGN PATENT DOCUMENTS

JP   08247783    9/1996
WO   9854583 A1  12/1998
WO   0155733 A1   8/2001

OTHER PUBLICATIONS

Webopedia, https://web.archive.org/web/20021015112112/http://www.webopedia.com/TERM/F/flat_file_system.html, 2 pp., Oct. 15, 2002.*
(Continued)

Primary Examiner — Marc S Somers
(74) Attorney, Agent, or Firm — Gerald Hespos; Matthew J. Porco; Matthew T. Hespos

(57) ABSTRACT

The present disclosure provides methods and systems for improving a data transfer rate from an intelligent electronic device (IED) to external PC clients, via a network interface. In one embodiment, an FTP based approach is disclosed which allows for significant optimization of download speeds providing as much a 100 times the download speed capability. In accordance with one aspect of present disclosure, an improved data rate is achieved by utilizing a high-speed transfer protocol, such as the FTP protocol in conjunction with a novel file system incorporated into the IED.

25 Claims, 8 Drawing Sheets

Related U.S. Application Data continuation-in-part of application No. 12/036,356, filed on Feb. 25, 2008, now Pat. No. 7,899,630, which is a continuation of application No. 11/341,802, filed on Jan. 27, 2006, now Pat. No. 7,337,081, said application No. 12/061,979 is a continuation-in-part of application No. 11/998,920, filed on Dec. 3, 2007, now Pat. No. 7,999,696, which is a continuation of application No. 10/969,706, filed on Oct. 20, 2004, now Pat. No. 7,304,586.

(60) Provisional application No. 60/647,669, filed on Jan. 27, 2005, provisional application No. 60/921,651, filed on Apr. 3, 2007, provisional application No. 60/921,659, filed on Apr. 3, 2007.

(51) Int. Cl.

| | | |
|---|---|---|
| *G06F 16/11* | (2019.01) | |
| *G06F 16/25* | (2019.01) | |
| *G06F 16/18* | (2019.01) | |
| *G06F 16/23* | (2019.01) | |
| *H04L 29/08* | (2006.01) | |
| *G01R 19/25* | (2006.01) | |
| *G01R 22/10* | (2006.01) | |
| *G01D 4/00* | (2006.01) | |

(52) U.S. Cl.
CPC .......... *G06F 3/0655* (2013.01); *G06F 3/0688* (2013.01); *G06F 16/116* (2019.01); *G06F 16/1847* (2019.01); *G06F 16/1865* (2019.01); *G06F 16/2358* (2019.01); *G06F 16/258* (2019.01); *G06F 16/27* (2019.01); *H04L 67/06* (2013.01); *G01R 19/2513* (2013.01); *G01R 22/10* (2013.01); *Y02B 90/242* (2013.01); *Y04S 20/322* (2013.01)

(56) References Cited

U.S. PATENT DOCUMENTS

| | | |
|---|---|---|
| 2,435,753 A | 2/1948 | Walther et al. |
| 2,606,943 A | 8/1952 | Barker |
| 2,883,255 A | 4/1959 | Anderson |
| 2,900,605 A | 8/1959 | Squires et al. |
| 2,987,704 A | 6/1961 | Gimpel et al. |
| 2,992,365 A | 7/1961 | Brill |
| 3,084,863 A | 4/1963 | Du |
| 3,142,820 A | 7/1964 | Daniels |
| 3,166,726 A | 1/1965 | Jensen et al. |
| 3,205,439 A | 9/1965 | Michael et al. |
| 3,333,194 A | 7/1967 | Reynolds |
| 3,453,540 A | 7/1969 | Dusheck |
| 3,458,810 A | 7/1969 | Wald |
| 3,467,864 A | 9/1969 | Plaats |
| 3,504,164 A | 3/1970 | Farrell et al. |
| 3,534,247 A | 10/1970 | Miljanic |
| 3,535,637 A | 10/1970 | Goransson |
| 3,629,852 A | 12/1971 | Thexton et al. |
| 3,737,891 A | 6/1973 | Metcalf |
| 3,815,013 A | 6/1974 | Milkovic |
| 3,824,441 A | 7/1974 | Heyman et al. |
| 3,995,210 A | 11/1976 | Milkovic |
| 4,066,960 A | 1/1978 | Milkovic |
| 4,077,061 A | 2/1978 | Johnston et al. |
| 4,140,952 A | 2/1979 | Miller |
| 4,158,810 A | 6/1979 | Leskovar |
| 4,182,983 A | 1/1980 | Heinrich et al. |
| 4,215,697 A | 8/1980 | Demetrescu |
| 4,240,149 A | 12/1980 | Fletcher et al. |
| 4,246,623 A | 1/1981 | Sun |
| 4,255,707 A | 3/1981 | Miller |
| 4,283,772 A | 8/1981 | Johnston |
| 4,336,736 A | 6/1982 | Mishima |
| 4,345,311 A | 8/1982 | Fielden |
| 4,360,879 A | 11/1982 | Cameron |
| 4,415,896 A | 11/1983 | Allgood |
| 4,437,059 A | 3/1984 | Hauptmann |
| 4,442,492 A | 4/1984 | Karlsson et al. |
| 4,463,311 A | 7/1984 | Kobayashi |
| 4,466,071 A | 8/1984 | Russell |
| 4,486,707 A | 12/1984 | Randall et al. |
| 4,495,463 A | 1/1985 | Milkovic |
| 4,608,533 A | 8/1986 | Starkie |
| 4,623,997 A * | 11/1986 | Tulpule .................. G06F 13/28 711/141 |
| 4,689,752 A | 8/1987 | Fernandes et al. |
| 4,709,339 A | 11/1987 | Fernandes |
| 4,713,608 A | 12/1987 | Catiller et al. |
| 4,713,609 A | 12/1987 | Losapio et al. |
| 4,742,296 A | 5/1988 | Petr et al. |
| 4,799,008 A | 1/1989 | Kannari |
| 4,804,957 A | 2/1989 | Selph et al. |
| 4,839,819 A | 6/1989 | Begin et al. |
| 4,841,236 A | 6/1989 | Miljanic et al. |
| 4,843,311 A | 6/1989 | Rozman et al. |
| 4,884,021 A | 11/1989 | Hammond et al. |
| 4,897,599 A | 1/1990 | Koslar |
| 4,902,965 A | 2/1990 | Bodrug et al. |
| 4,933,633 A | 6/1990 | Allgood |
| 4,949,029 A | 8/1990 | Cooper et al. |
| 4,958,294 A | 9/1990 | Herscher et al. |
| 4,958,640 A | 9/1990 | Logan |
| 4,979,122 A | 12/1990 | Davis et al. |
| 4,989,155 A | 1/1991 | Begin et al. |
| 4,996,646 A | 2/1991 | Farrington |
| 4,999,572 A | 3/1991 | Bickford et al. |
| 5,006,790 A | 4/1991 | Beverly et al. |
| 5,006,846 A | 4/1991 | Granville et al. |
| 5,014,229 A | 5/1991 | Mofachern |
| 5,017,860 A | 5/1991 | Germer et al. |
| 5,079,715 A | 1/1992 | Venkataraman et al. |
| 5,081,701 A * | 1/1992 | Silver .................. G06F 13/423 710/105 |
| 5,122,735 A | 6/1992 | Porter et al. |
| 5,132,609 A | 7/1992 | Nguyen |
| 5,132,610 A | 7/1992 | Ying-Chang |
| 5,166,887 A | 11/1992 | Farrington et al. |
| 5,170,115 A | 12/1992 | Kashiwabara et al. |
| 5,170,360 A | 12/1992 | Porter et al. |
| 5,185,705 A | 2/1993 | Farrington |
| 5,212,441 A | 5/1993 | McEachern et al. |
| 5,220,495 A | 6/1993 | Zulaski |
| 5,224,054 A | 6/1993 | Wallis |
| 5,226,120 A | 7/1993 | Brown et al. |
| 5,229,713 A | 7/1993 | Bullock et al. |
| 5,233,538 A | 8/1993 | Wallis |
| 5,237,511 A | 8/1993 | Caird et al. |
| 5,243,536 A | 9/1993 | Bradford |
| 5,245,275 A | 9/1993 | Germer et al. |
| 5,248,935 A | 9/1993 | Sakoyama et al. |
| 5,248,967 A | 9/1993 | Daneshfar |
| 5,258,704 A | 11/1993 | Germer et al. |
| 5,289,115 A | 2/1994 | Germer et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,301,121 A | 4/1994 | Garverick et al. |
| 5,302,890 A | 4/1994 | McEachern et al. |
| 5,307,009 A | 4/1994 | McEachern et al. |
| 5,315,527 A | 5/1994 | Beckwith |
| 5,343,143 A | 8/1994 | Voisine et al. |
| 5,347,464 A | 9/1994 | McEachern et al. |
| 5,391,983 A | 2/1995 | Lusignan et al. |
| 5,402,148 A | 3/1995 | Post et al. |
| 5,406,495 A | 4/1995 | Hill |
| 5,438,257 A | 8/1995 | Berkcan |
| 5,442,279 A | 8/1995 | Kitayoshi et al. |
| 5,450,007 A | 9/1995 | Payne et al. |

(56) References Cited

U.S. PATENT DOCUMENTS

| | | | |
|---|---|---|---|
| 5,453,697 A | 9/1995 | Schweer et al. | |
| 5,459,395 A | 10/1995 | Berkcan | |
| 5,459,459 A | 10/1995 | Lee, Jr. | |
| 5,475,628 A | 12/1995 | Adams et al. | |
| 5,514,958 A | 5/1996 | Germer | |
| 5,528,507 A | 6/1996 | McNamara et al. | |
| 5,537,340 A | 7/1996 | Gawlik | |
| 5,544,064 A | 8/1996 | Beckwith | |
| 5,548,527 A | 8/1996 | Hemminger et al. | |
| 5,555,508 A | 9/1996 | Munday et al. | |
| 5,559,719 A | 9/1996 | Johnson et al. | |
| 5,563,506 A | 10/1996 | Fielden et al. | |
| 5,568,047 A | 10/1996 | Staver et al. | |
| 5,572,438 A | 11/1996 | Ehlers et al. | |
| 5,574,654 A | 11/1996 | Bingham et al. | |
| 5,581,173 A | 12/1996 | Yalla et al. | |
| 5,592,195 A | 1/1997 | Jackson et al. | |
| 5,606,510 A | 2/1997 | Glaser et al. | |
| 5,619,142 A | 4/1997 | Schweer et al. | |
| 5,627,759 A | 5/1997 | Bearden et al. | |
| 5,642,300 A | 6/1997 | Gubisch et al. | |
| 5,650,936 A | 7/1997 | Loucks et al. | |
| 5,706,204 A | 1/1998 | Cox et al. | |
| 5,706,214 A | 1/1998 | Putt et al. | |
| 5,734,571 A | 3/1998 | Pilz et al. | |
| 5,736,847 A | 4/1998 | Doom et al. | |
| 5,737,231 A | 4/1998 | Pyle et al. | |
| 5,757,357 A | 5/1998 | Grande et al. | |
| 5,764,523 A | 6/1998 | Yoshinaga et al. | |
| 5,768,632 A | 6/1998 | Husted et al. | |
| 5,774,366 A | 6/1998 | Beckwith | |
| 5,801,643 A | 9/1998 | Williams et al. | |
| 5,819,203 A | 10/1998 | Moore et al. | |
| 5,822,165 A | 10/1998 | Moran | |
| 5,828,576 A | 10/1998 | Loucks et al. | |
| 5,832,210 A | 11/1998 | Akiyama et al. | |
| 5,862,391 A | 1/1999 | Salas et al. | |
| 5,874,903 A | 2/1999 | Shuey et al. | |
| 5,890,097 A | 3/1999 | Cox | |
| 5,892,758 A | 4/1999 | Argyroudis | |
| 5,896,547 A | 4/1999 | Lee | |
| 5,897,607 A | 4/1999 | Jenney et al. | |
| 5,898,387 A | 4/1999 | Davis et al. | |
| 5,899,960 A | 5/1999 | Moore et al. | |
| 5,907,238 A | 5/1999 | Owerko et al. | |
| 5,933,029 A | 8/1999 | Kuroda et al. | |
| 5,952,819 A | 9/1999 | Berkcan et al. | |
| 5,963,734 A | 10/1999 | Ackerman et al. | |
| 5,978,655 A | 11/1999 | Ohura et al. | |
| 5,986,574 A | 11/1999 | Colton | |
| 5,994,892 A | 11/1999 | Turin et al. | |
| 5,995,911 A | 11/1999 | Hart | |
| 6,000,034 A | 12/1999 | Lightbody et al. | |
| 6,011,519 A | 1/2000 | Sadler et al. | |
| 6,018,690 A | 1/2000 | Saito et al. | |
| 6,018,700 A | 1/2000 | Edel | |
| 6,023,160 A | 2/2000 | Coburn | |
| 6,032,109 A | 2/2000 | Ritmiller | |
| 6,038,516 A | 3/2000 | Alexander et al. | |
| 6,041,257 A * | 3/2000 | MacDuff | G01D 3/02 607/5 |
| 6,064,192 A | 5/2000 | Redmyer | |
| 6,073,169 A | 6/2000 | Shuey et al. | |
| 6,098,175 A | 8/2000 | Lee | |
| 6,100,817 A | 8/2000 | Mason et al. | |
| 6,112,136 A | 8/2000 | Paul et al. | |
| 6,133,720 A | 10/2000 | Elmore | |
| 6,157,329 A | 12/2000 | Lee et al. | |
| 6,163,243 A | 12/2000 | Titus | |
| 6,167,329 A | 12/2000 | Engel et al. | |
| 6,185,508 B1 | 2/2001 | Doom et al. | |
| 6,186,842 B1 | 2/2001 | Hirschbold et al. | |
| 6,195,614 B1 | 2/2001 | Kochan | |
| 6,236,949 B1 | 5/2001 | Hart | |
| 6,262,672 B1 | 7/2001 | Brooksby et al. | |
| 6,269,316 B1 | 7/2001 | Hubbard et al. | |
| 6,289,267 B1 | 9/2001 | Alexander et al. | |
| 6,292,717 B1 | 9/2001 | Alexander et al. | |
| 6,301,527 B1 | 10/2001 | Butland et al. | |
| 6,363,057 B1 | 3/2002 | Ardalan et al. | |
| 6,374,084 B1 | 4/2002 | Fok | |
| 6,396,421 B1 | 5/2002 | Bland | |
| 6,396,839 B1 | 5/2002 | Ardalan et al. | |
| 6,397,155 B1 | 5/2002 | Przydatek et al. | |
| 6,401,054 B1 | 6/2002 | Andersen | |
| 6,415,244 B1 | 7/2002 | Dickens et al. | |
| 6,417,661 B1 | 7/2002 | Berkcan et al. | |
| 6,418,450 B2 | 7/2002 | Daudenarde | |
| 6,423,960 B1 | 7/2002 | Engelhardt et al. | |
| 6,429,637 B1 | 8/2002 | Gandhi | |
| 6,433,981 B1 | 8/2002 | Fletcher et al. | |
| 6,437,692 B1 | 8/2002 | Petite et al. | |
| 6,438,651 B1 * | 8/2002 | Slane | G06F 12/0875 710/39 |
| 6,444,971 B1 | 9/2002 | Engelhardt et al. | |
| 6,479,976 B1 | 11/2002 | Edel | |
| 6,483,291 B1 | 11/2002 | Bhateja et al. | |
| 6,493,644 B1 | 12/2002 | Jonker et al. | |
| 6,509,850 B1 | 1/2003 | Bland | |
| 6,519,537 B1 | 2/2003 | Yang | |
| 6,522,517 B1 | 2/2003 | Edel | |
| 6,526,581 B1 | 2/2003 | Edson | |
| 6,528,957 B1 | 3/2003 | Luchaco | |
| 6,538,577 B1 | 3/2003 | Ehrke et al. | |
| 6,542,838 B1 | 4/2003 | Haddad et al. | |
| 6,553,418 B1 | 4/2003 | Collins et al. | |
| 6,563,697 B1 | 5/2003 | Simbeck et al. | |
| 6,590,380 B2 | 7/2003 | Edel | |
| 6,611,773 B2 | 8/2003 | Przydatek et al. | |
| 6,611,922 B2 | 8/2003 | Ozcetin et al. | |
| 6,615,147 B1 | 9/2003 | Jonker et al. | |
| 6,621,433 B1 | 9/2003 | Hertz | |
| 6,636,030 B1 | 10/2003 | Rose et al. | |
| 6,639,538 B1 | 10/2003 | Sechi et al. | |
| 6,657,552 B2 | 12/2003 | Belski et al. | |
| 6,661,357 B2 | 12/2003 | Bland | |
| 6,671,635 B1 | 12/2003 | Forth et al. | |
| 6,671,654 B1 | 12/2003 | Forth et al. | |
| 6,671,802 B1 | 12/2003 | Ott | |
| 6,674,379 B1 | 1/2004 | Li et al. | |
| 6,687,627 B1 | 2/2004 | Gunn et al. | |
| 6,694,270 B2 | 2/2004 | Hart | |
| 6,701,264 B2 | 3/2004 | Caso et al. | |
| 6,714,881 B2 | 3/2004 | Carlson et al. | |
| 6,717,394 B2 | 4/2004 | Elms | |
| 6,732,124 B1 * | 5/2004 | Koseki | G06F 11/1435 707/202 |
| 6,735,535 B1 | 5/2004 | Kagan et al. | |
| 6,737,855 B2 | 5/2004 | Huber et al. | |
| 6,745,138 B2 | 6/2004 | Przydatek et al. | |
| 6,751,562 B1 | 6/2004 | Blackett et al. | |
| 6,751,563 B2 | 6/2004 | Spanier et al. | |
| 6,757,628 B1 | 6/2004 | Anderson et al. | |
| 6,759,837 B2 | 7/2004 | Gandhi | |
| 6,762,675 B1 | 7/2004 | Cafiero et al. | |
| 6,792,337 B2 | 9/2004 | Blackett et al. | |
| 6,792,364 B2 | 9/2004 | Jonker et al. | |
| 6,798,190 B2 | 9/2004 | Harding et al. | |
| 6,798,191 B1 | 9/2004 | Macfarlane et al. | |
| 6,801,865 B2 | 10/2004 | Gilgenbach et al. | |
| 6,813,571 B2 | 11/2004 | Lightbody et al. | |
| 6,817,890 B1 | 11/2004 | Schindler | |
| 6,825,776 B2 | 11/2004 | Lightbody et al. | |
| 6,829,267 B2 | 12/2004 | Vaughan et al. | |
| 6,836,737 B2 | 12/2004 | Petite et al. | |
| 6,842,707 B2 | 1/2005 | Raichle et al. | |
| 6,853,978 B2 | 2/2005 | Forth et al. | |
| 6,871,150 B2 | 3/2005 | Huber et al. | |
| 6,894,979 B1 | 5/2005 | Lee | |
| 6,900,738 B2 | 5/2005 | Crichlow | |
| 6,934,754 B2 | 8/2005 | West et al. | |
| 6,944,555 B2 | 9/2005 | Blackett et al. | |
| 6,957,158 B1 | 10/2005 | Hancock et al. | |
| 6,957,275 B1 | 10/2005 | Sekiguchi | |

(56) References Cited

U.S. PATENT DOCUMENTS

| | | |
|---|---|---|
| 6,961,641 B1 | 11/2005 | Forth et al. |
| 6,963,195 B1 | 11/2005 | Berkcan |
| 6,972,364 B2 | 12/2005 | Diedrichsen |
| 6,975,209 B2 | 12/2005 | Gromov |
| 6,983,211 B2 | 1/2006 | Macfarlene et al. |
| 6,985,087 B2 | 1/2006 | Soliman |
| 6,988,025 B2 | 1/2006 | Ransom et al. |
| 6,988,043 B1 | 1/2006 | Randall |
| 6,988,182 B2 | 1/2006 | Teachman et al. |
| 6,989,735 B2 | 1/2006 | Fisher et al. |
| 6,990,395 B2 | 1/2006 | Ransom et al. |
| 7,006,934 B2 | 2/2006 | Jonker et al. |
| 7,010,438 B2 | 3/2006 | Hancock et al. |
| 7,043,459 B2 | 5/2006 | Peevey |
| 7,047,216 B2 | 5/2006 | Kashti |
| 7,049,975 B2 | 5/2006 | Vanderah et al. |
| 7,050,808 B2 | 5/2006 | Janusz et al. |
| 7,050,916 B2 | 5/2006 | Curtis et al. |
| 7,072,779 B2 | 7/2006 | Hancock et al. |
| 7,085,824 B2 | 8/2006 | Forth et al. |
| 7,089,089 B2 | 8/2006 | Cumming et al. |
| 7,126,439 B2 | 10/2006 | Qi et al. |
| 7,126,493 B2 | 10/2006 | Junker |
| 7,127,328 B2 | 10/2006 | Ransom |
| 7,135,956 B2 | 11/2006 | Bartone et al. |
| 7,136,384 B1 | 11/2006 | Wang |
| 7,155,350 B2 | 12/2006 | Kagan |
| 7,158,050 B2 | 1/2007 | Lightbody et al. |
| 7,171,467 B2 | 1/2007 | Carley |
| 7,174,258 B2 | 2/2007 | Hart |
| 7,174,261 B2 | 2/2007 | Gunn et al. |
| 7,188,003 B2 | 3/2007 | Ransom et al. |
| 7,191,076 B2 | 3/2007 | Huber et al. |
| 7,196,673 B2 | 3/2007 | Savage et al. |
| 7,203,736 B1 | 4/2007 | Burnett et al. |
| 7,209,804 B2 | 4/2007 | Curt et al. |
| 7,216,043 B2 | 5/2007 | Ransom et al. |
| 7,239,184 B2 | 7/2007 | Cetrulo et al. |
| 7,243,050 B2 | 7/2007 | Armstrong |
| 7,246,014 B2 | 7/2007 | Forth et al. |
| 7,248,977 B2 | 7/2007 | Hart |
| 7,248,978 B2 | 7/2007 | Ransom |
| 7,249,265 B2 | 7/2007 | Carolsfeld et al. |
| 7,256,709 B2 | 8/2007 | Kagan |
| 7,257,107 B2 | 8/2007 | Swier, Jr. et al. |
| 7,271,996 B2 | 9/2007 | Kagan et al. |
| 7,294,997 B2 | 11/2007 | Kagan |
| 7,304,586 B2 | 12/2007 | Wang et al. |
| 7,304,829 B2 | 12/2007 | Nadipuram et al. |
| 7,305,310 B2 | 12/2007 | Slota et al. |
| 7,313,176 B1 | 12/2007 | Groen |
| 7,337,081 B1 | 2/2008 | Kagan |
| 7,342,507 B2 | 3/2008 | Jonker |
| 7,346,786 B1 | 3/2008 | Dimick et al. |
| 7,359,809 B2 | 4/2008 | Bruno |
| 7,372,574 B2 | 5/2008 | Sanders et al. |
| 7,379,997 B2 | 5/2008 | Ehlers et al. |
| 7,395,323 B2 | 7/2008 | Larson et al. |
| 7,415,368 B2 | 8/2008 | Gilbert et al. |
| 7,436,687 B2 | 10/2008 | Patel |
| 7,444,454 B2 | 10/2008 | Yancey et al. |
| 7,447,760 B2 | 11/2008 | Forth et al. |
| 7,447,762 B2 | 11/2008 | Curray et al. |
| 7,486,624 B2 | 2/2009 | Shaw et al. |
| 7,511,468 B2 | 3/2009 | McEachern et al. |
| 7,514,907 B2 | 4/2009 | Rajda et al. |
| 7,554,320 B2 | 6/2009 | Kagan |
| 7,577,542 B2 | 8/2009 | Vacar et al. |
| 7,616,656 B2 | 11/2009 | Wang et al. |
| 7,630,863 B2 | 12/2009 | Zweigle et al. |
| 7,660,682 B2 | 2/2010 | Slota et al. |
| 7,761,910 B2 | 7/2010 | Ransom et al. |
| 7,765,127 B2 | 7/2010 | Banks et al. |
| 7,877,169 B2 | 1/2011 | Slota et al. |
| 7,881,907 B2 | 2/2011 | Curt et al. |
| 7,899,630 B2 | 3/2011 | Kagan |
| 7,916,060 B2 | 3/2011 | Zhu et al. |
| 7,920,976 B2 | 4/2011 | Banhegyesi |
| 7,953,899 B1 | 5/2011 | Hooper |
| 7,962,298 B2 | 6/2011 | Przydatek et al. |
| 7,974,713 B2 | 7/2011 | Disch et al. |
| 7,996,171 B2 | 8/2011 | Banhegyesi |
| 7,999,696 B2 | 8/2011 | Wang et al. |
| 8,022,690 B2 | 9/2011 | Kagan |
| 8,063,704 B2 | 11/2011 | Wu et al. |
| 8,073,642 B2 | 12/2011 | Slota et al. |
| 8,078,418 B2 | 12/2011 | Banhegyesi et al. |
| 8,107,491 B2 | 1/2012 | Wang et al. |
| 8,121,801 B2 | 2/2012 | Spanier et al. |
| 8,160,824 B2 | 4/2012 | Spanier et al. |
| 8,190,381 B2 | 5/2012 | Spanier et al. |
| 8,269,482 B2 | 9/2012 | Banhegyesi |
| 8,442,660 B2 | 5/2013 | Kagan |
| 8,515,348 B2 | 8/2013 | Kagan |
| 8,599,036 B2 | 12/2013 | Wang et al. |
| 8,620,608 B2 | 12/2013 | Banhegyesi et al. |
| 8,666,688 B2 | 3/2014 | Spanier et al. |
| 8,700,347 B2 | 4/2014 | Spanier et al. |
| 8,797,202 B2 | 8/2014 | Zhu et al. |
| 8,862,435 B2 | 10/2014 | Spanier et al. |
| 8,878,517 B2 | 11/2014 | Banhegyesi |
| 8,930,153 B2 | 1/2015 | Kagan et al. |
| 8,933,815 B2 | 1/2015 | Kagan et al. |
| 9,080,894 B2 | 7/2015 | Spanier et al. |
| 9,194,898 B2 | 11/2015 | Banhegyesi et al. |
| 9,482,555 B2 | 11/2016 | Spanier et al. |
| 9,696,180 B2 | 7/2017 | Kagan |
| 9,903,895 B2 | 2/2018 | Banhegyesi et al. |
| 9,989,618 B2 | 6/2018 | Spanier et al. |
| 2001/0038343 A1 | 11/2001 | Meyer et al. |
| 2001/0038689 A1* | 11/2001 | Liljestrand ........ H04M 3/42153 379/201.03 |
| 2002/0014884 A1 | 2/2002 | Chung |
| 2002/0018399 A1 | 2/2002 | Schultz et al. |
| 2002/0026957 A1 | 3/2002 | Reyman |
| 2002/0032535 A1 | 3/2002 | Alexander et al. |
| 2002/0048269 A1 | 4/2002 | Hong et al. |
| 2002/0072868 A1 | 6/2002 | Bartone et al. |
| 2002/0073211 A1 | 6/2002 | Lin et al. |
| 2002/0091784 A1* | 7/2002 | Baker .................... G05B 19/05 709/208 |
| 2002/0105435 A1 | 8/2002 | Yee et al. |
| 2002/0109608 A1 | 8/2002 | Petite et al. |
| 2002/0114326 A1 | 8/2002 | Mahalingaiah |
| 2002/0120723 A1 | 8/2002 | Forth et al. |
| 2002/0129342 A1 | 9/2002 | Kil et al. |
| 2002/0162014 A1 | 10/2002 | Przydatek et al. |
| 2002/0165677 A1 | 11/2002 | Lightbody et al. |
| 2002/0169570 A1 | 11/2002 | Spanier et al. |
| 2002/0180420 A1 | 12/2002 | Lavoie et al. |
| 2003/0009401 A1 | 1/2003 | Ellis |
| 2003/0014200 A1 | 1/2003 | Jonker et al. |
| 2003/0018982 A1 | 1/2003 | Zeidler et al. |
| 2003/0025620 A1 | 2/2003 | Bland |
| 2003/0065459 A1 | 4/2003 | Huber et al. |
| 2003/0076247 A1 | 4/2003 | Bland |
| 2003/0084112 A1 | 5/2003 | Curray et al. |
| 2003/0093429 A1 | 5/2003 | Nishikawa et al. |
| 2003/0101008 A1 | 5/2003 | Hart |
| 2003/0105608 A1 | 6/2003 | Hart |
| 2003/0132742 A1 | 7/2003 | Harding et al. |
| 2003/0154471 A1 | 8/2003 | Teachman et al. |
| 2003/0176952 A1 | 9/2003 | Collins et al. |
| 2003/0178982 A1 | 9/2003 | Elms |
| 2003/0178985 A1 | 9/2003 | Briese et al. |
| 2003/0185110 A1* | 10/2003 | Fujisawa ............. G11B 27/002 369/30.05 |
| 2003/0187550 A1 | 10/2003 | Wilson et al. |
| 2003/0204756 A1 | 10/2003 | Ransom et al. |
| 2003/0210699 A1 | 11/2003 | Holt et al. |
| 2003/0212512 A1 | 11/2003 | Hart |
| 2003/0220752 A1 | 11/2003 | Hart |
| 2003/0226058 A1 | 12/2003 | Miller et al. |
| 2004/0049524 A1 | 3/2004 | Toyota et al. |

(56) References Cited

U.S. PATENT DOCUMENTS

| | | |
|---|---|---|
| 2004/0064198 A1 | 4/2004 | Reynolds et al. |
| 2004/0066311 A1 | 4/2004 | Giles et al. |
| 2004/0078474 A1 | 4/2004 | Ramaswamy |
| 2004/0083066 A1 | 4/2004 | Hayes et al. |
| 2004/0113810 A1 | 6/2004 | Mason et al. |
| 2004/0122833 A1 | 6/2004 | Gilbert et al. |
| 2004/0128260 A1 | 7/2004 | Amedure et al. |
| 2004/0138786 A1 | 7/2004 | Blackett et al. |
| 2004/0138787 A1 | 7/2004 | Ransom et al. |
| 2004/0138835 A1 | 7/2004 | Ransom et al. |
| 2004/0167686 A1 | 8/2004 | Baker et al. |
| 2004/0172207 A1 | 9/2004 | Hancock et al. |
| 2004/0177062 A1 | 9/2004 | Urquhart et al. |
| 2004/0183522 A1 | 9/2004 | Gunn et al. |
| 2004/0193329 A1 | 9/2004 | Ransom et al. |
| 2004/0208182 A1 | 10/2004 | Boles et al. |
| 2004/0229578 A1 | 11/2004 | Lightbody et al. |
| 2005/0017874 A1 | 1/2005 | Lightbody et al. |
| 2005/0021252 A1 | 1/2005 | Hui |
| 2005/0027464 A1 | 2/2005 | Jonker et al. |
| 2005/0039040 A1 | 2/2005 | Ransom et al. |
| 2005/0060110 A1 | 3/2005 | Jones et al. |
| 2005/0071106 A1 | 3/2005 | Huber et al. |
| 2005/0093571 A1 | 5/2005 | Suaris |
| 2005/0144437 A1 | 6/2005 | Ransom et al. |
| 2005/0165585 A1 | 7/2005 | Bhateja et al. |
| 2005/0187725 A1 | 8/2005 | Cox |
| 2005/0220079 A1 | 10/2005 | Asokan |
| 2005/0240362 A1 | 10/2005 | Randall |
| 2005/0243204 A1 | 11/2005 | Zhu |
| 2005/0273183 A1 | 12/2005 | Curt et al. |
| 2005/0273280 A1 | 12/2005 | Cox |
| 2005/0275397 A1 | 12/2005 | Lightbody et al. |
| 2005/0288876 A1 | 12/2005 | Doig et al. |
| 2005/0288877 A1 | 12/2005 | Doig et al. |
| 2006/0020405 A1 | 1/2006 | Kagan |
| 2006/0020634 A1* | 1/2006 | Huras .............. G06F 17/30368 707/200 |
| 2006/0047787 A1 | 3/2006 | Agarwal et al. |
| 2006/0049694 A1 | 3/2006 | Kates |
| 2006/0052958 A1 | 3/2006 | Hancock et al. |
| 2006/0066456 A1 | 3/2006 | Jonker |
| 2006/0066903 A1 | 3/2006 | Shiimori |
| 2006/0077999 A1 | 4/2006 | Kagan et al. |
| 2006/0083260 A1 | 4/2006 | Wang et al. |
| 2006/0085419 A1 | 4/2006 | Rosen |
| 2006/0086893 A1 | 4/2006 | Spanier et al. |
| 2006/0095219 A1 | 5/2006 | Bruno |
| 2006/0116842 A1* | 6/2006 | Tarantola .............. G01D 21/00 702/122 |
| 2006/0145890 A1 | 7/2006 | Junker et al. |
| 2006/0161360 A1 | 7/2006 | Yao et al. |
| 2006/0161400 A1 | 7/2006 | Kagan |
| 2006/0170409 A1 | 8/2006 | Kagan et al. |
| 2006/0187956 A1 | 8/2006 | Doviak et al. |
| 2006/0200599 A1 | 9/2006 | Manchester et al. |
| 2006/0230394 A1 | 10/2006 | Forth et al. |
| 2006/0267560 A1 | 11/2006 | Rajda et al. |
| 2006/0271244 A1 | 11/2006 | Cumming et al. |
| 2006/0271314 A1 | 11/2006 | Hayes |
| 2007/0058634 A1 | 3/2007 | Gupta et al. |
| 2007/0067119 A1 | 3/2007 | Loewen et al. |
| 2007/0067121 A1 | 3/2007 | Przydatek et al. |
| 2007/0081597 A1 | 4/2007 | Disch et al. |
| 2007/0096765 A1 | 5/2007 | Kagan |
| 2007/0096942 A1 | 5/2007 | Kagan et al. |
| 2007/0112446 A1 | 5/2007 | Deveaux et al. |
| 2007/0114987 A1 | 5/2007 | Kagan |
| 2007/0136010 A1 | 6/2007 | Gunn et al. |
| 2007/0152058 A1 | 7/2007 | Yeakley et al. |
| 2008/0046205 A1 | 2/2008 | Gilbert et al. |
| 2008/0065335 A1 | 3/2008 | Doig et al. |
| 2008/0075194 A1 | 3/2008 | Ravi et al. |
| 2008/0086222 A1 | 4/2008 | Kagan |
| 2008/0091770 A1 | 4/2008 | Petras et al. |
| 2008/0147334 A1 | 6/2008 | Kagan |
| 2008/0158008 A1 | 7/2008 | Kagan et al. |
| 2008/0172192 A1 | 7/2008 | Banhegyesi |
| 2008/0195794 A1 | 8/2008 | Banker |
| 2008/0215264 A1 | 9/2008 | Spanier et al. |
| 2008/0234957 A1 | 9/2008 | Banhegyesi et al. |
| 2008/0235355 A1 | 9/2008 | Spanier et al. |
| 2008/0238406 A1 | 10/2008 | Banhegyesi |
| 2008/0238713 A1 | 10/2008 | Banhegyesi et al. |
| 2008/0252481 A1 | 10/2008 | Vacar et al. |
| 2009/0012728 A1 | 1/2009 | Spanier et al. |
| 2009/0066528 A1 | 3/2009 | Bickel et al. |
| 2009/0072813 A1 | 3/2009 | Banhegyesi |
| 2009/0096654 A1 | 4/2009 | Zhu et al. |
| 2009/0228224 A1 | 9/2009 | Spanier et al. |
| 2009/0247146 A1 | 10/2009 | Wesby |
| 2009/0265124 A1 | 10/2009 | Kagan |
| 2010/0054276 A1 | 3/2010 | Wang et al. |
| 2010/0153036 A1 | 6/2010 | Elwarry et al. |
| 2010/0169876 A1 | 7/2010 | Mann |
| 2010/0324845 A1 | 12/2010 | Spanier et al. |
| 2011/0040809 A1 | 2/2011 | Spanier et al. |
| 2011/0153697 A1 | 6/2011 | Nickolov et al. |
| 2011/0158244 A1 | 6/2011 | Long et al. |
| 2011/0260710 A1 | 10/2011 | Zhu et al. |
| 2011/0270551 A1 | 11/2011 | Kagan et al. |
| 2012/0025807 A1 | 2/2012 | Banhegyesi |
| 2012/0209057 A1 | 8/2012 | Siess et al. |
| 2012/0209552 A1 | 8/2012 | Spanier et al. |
| 2012/0209557 A1 | 8/2012 | Crandall et al. |
| 2013/0158918 A1 | 6/2013 | Spanier et al. |
| 2014/0180613 A1 | 6/2014 | Banhegyesi et al. |
| 2014/0222357 A1 | 8/2014 | Spanier et al. |

OTHER PUBLICATIONS

Cerf et al, A Protocol for Packet Network Intercommunication, IEEE Trans on Comms, vol. Com-22, No. 5, May 1974, 13 pp. (Year: 1974).*

7700 Ion 3-Phase Power Meter, Analyzer and Controller, pp. 1-8, Nov. 30, 2000.

Braden, R (editor), "Requirements for Internet Hosts-Application and Support", RFC 1123, pp. 1-97, Oct. 1989.

Communicator EXT 3.0 User Manual Revision 1.32, Electro Industries/Gauge Tech, pp. 213-344, Aug. 27, 2007.

Deutsch, P., Emtage, A., and Marine, A., "How to Use Anonymous FTP", RFC1635, pp. 1-13, May 1994.

Futura+Series, "Advanced Power Monitoring and Analysis for the 21st Century", Electro Industries/Gauge Tech, specification, 8 pages, Apr. 13, 2000.

Hubbell, "What is flat file?", WhatIs.com, http://searchsqlserver.techtarget.com/definition/flat-file, Jul. 2006, 1 pp.

IEC 61000-4-15: Electromagnetic compatibility (EMC) Part 4: Testing and measuring techniques, Section 15: Flickermeter—Functional and design specifications; CENELEC—European Committee for Electrotechnical Standardization; pp. 1-25; Apr. 1998.

ION Technology 7500 ION 7600 ION High Visibility Energy and Power Quality Compliance Meters, specification, Power Measurement, pp. 1-8, revision date Nov. 30, 2000.

ION Technology, 7500 ION High Visibility 3-Phase Energy & Power Quality Meter, Power Measurement, specification, pp. 1-8, revision date Mar. 21, 2000.

ION7550/ion7650 PowerLogic power-monitoring units, Technical data sheets, pp. 1-12, Copyright 2006 Schneider Electric.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure(r) Technology, Electro Industries/Gauge Tech, specification, 16 pages, Nov. 1999.

Performance Power Meter & Data Acquisition Node, Electro Industries/Gauge Tech, Nexus 1250 specification, 8 pages, Dec. 14, 2000.

Postel, J.B., and Reynolds, J.K. "File Transfer Protocol (FTP)", RFC959, pp. 1-66, Oct. 1985.

PowerLogic Series 4000 Circuit Monitors, pp. 1-4; Document #3020HO0601; Jan. 2006.

(56) References Cited

OTHER PUBLICATIONS

Speirs, "What is binary file?", WhatIs.com, http://whatis.techtarget.com/definition/binary-file, Apr. 2005, 1 pp.
User' Installation & Operation and User's Programming Manual, The Futura Series, Electro Industries, pp. 1-64, (c) 1995.
Zeinalipour-Yazti et al, MicroHash: An Efficient Index Structure for Flash-Based Sensor Devices, Proceedings of the 4th Conference on USENIX Conference on File and Storage Technologies, vol. 4, Dec. 2005, pp. 14.
European Standard EN-50160; "Voltage characteristics of electricity supplied by public distribution networks"; Copyright 2007 CENELEC; published Oct. 31, 2007; pp. 1-23.
International Standard IEC-61000-4-7, Second Edition; "Electromagnetic compatibility (EMC)—Part 4-7:Testing and measurement techniques"; Copyright Commission Electrotechnique Commission 2002; Geneva, Switzerland; pp. 1-80.
International Standard IEC-687, Second Edition; "Alternating current static watt-hours meters for active energy"; Copyright Commission Electrotechnique Commission 1992; Geneva, Switzerland; pp. 1-36.
"MuNet Demonstrates End-toEnd IP-Based Energy Management System at DistribuTECH," pp. 1-2 at http://www.munet.com/muNetNewPressReleases.sub.-0205001.htm, May 24, 2001.
"MuNet's WebGate IRIS Deployed for Utility Trials Across US", pp. 1-2 at http://www.munet.com/muNetNewPressReleases121300.htm.
"MuNet's WebGate System Finds a Home on the Internet," pp. 1-2 at http://www.munet.com/muNetNewPressReleases031899.htm, May 24, 2001.
"Power Quality—A guide to voltage fluctuation and light flicker"; BChydro Power Smart, Vancouver, B.C., Canada; Dated Mar. 2005; pp. 1-12.
"Webgate Icis (Internet Commercial Information System)", pp. 1 at http://www.munet.com/munetproductsicisindex.htm, "Products (WebGate ICIS Internet AMR now)," pp. 1-2 at http://www.munet.com/munetproductsicis.htm, Products Webgate ICIS Control Cenetr Software), pp. 1-2 at http://222.munet.com/munetproductsicisSpec.htm, May 24, 2001.
"Webgate Iris (Internet Residential Information System )"; http://www.munet.com/munetproducts.irisindex.html "Products," pp. 1-3; http://www.munet.com/munetproductsiris.html "Preliminary Specification" pp. 1-2; http://www.munet.com/munetproductsiris.sub.-Spec.html.
3720 ACM, 3-phase Power Instruction Package, Power Measurement, specification, 8 pages, revision date Dec. 16, 1998.
3720 ACM, Installation & Operation Manual, Power Measurement, 67 pages, revision date Apr. 4, 2000.
6200 ION, Installation & Basic Setup Instructions, (c)Power Measurement Ltd., Revision Date Apr. 25, 2001, 50 pages.
8400 ION/8500 ION Instruction Leaflet, Power Measurement, pp. 1-8, Oct. 1999.
8500 ION Technical Documentation, 8500 ION and 8500 ION-PQ Advanced Intelligent Billing Meters, specification, Power Measurement, revision date Apr. 15, 1999, 247 pp.
Brochure, Sentinel TM Electronic "Multimeasurement Meter," Schlumberger, Mar. 2001, 4 pages.
Electro Industries/Gauge Tech DM Series—specification brochure, "DMMS 425 Low-Cost Multifunction Power Monitoring Outperforms All Others in its Class", 4 pages.
Engage Network, Inc., "Internet Protocol Card for Revenue Meters", http://www.engagenet.com. Link present as of Mar. 2000 on http://web.archive.org/web/20010306005433/www.engagenet.com/content/produ- cts.shtml, 2 pp.
http://www.landisgyr.us/Landis_Gyr/Meters/2510_socket_meter.asp, Apr. 18, 2005, 25 pages.
IEEE Std 1159-1995; IEEE Recommended Practice for monitoring Electric Power Quality; Copyright the Institute of Electrical and Electronics Engineers, Inc. 1995; New York, NY; pp. 1-76.
IEEE Std 519-1992; IEEE Recommended Practices and Requirements for Harmonic Control in Electrical Power Systems; Copyright the Institute of Electrical and Electronics Engineers, Inc. 1993; New York, NY; pp. 1-101.
International Standard IEC-1180-1; "High-voltage test techniques for low-voltage equipment"; Copyright Commission Electrotechnique Commission 1992; Geneva, Switzerland; pp. 1-62.
International Standard IEC-61000-2-4, Second Edition; "Electromagnetic compatibility (EMC)—Part 2-4:Environment-Compatibility levels in industrial plants for low-frequency conducted disturbances"; Copyright Commission Electrotechnique Commission 2002; GenevaSwitzerland; pp. 1-84.
International Standard IEC-61000-4-30, First Edition; "Electromagnetic compatibility (EMC)—Part 4-30:Testing and measurement techniques—Power quality measurement methods"; Copyright Commission Electrotechnique Commission 2003; Geneva, Switzerland; pp. 1-98.
ION 7550/ION7650 User Guide Power Measurement—Revision Date Aug. 31, 2004, 190 pages.
ION Technology 7700 ION 3-Phase Power Meter, Analyzer and Controller, Power Measurement, specification, pp. 1-10, revision date Dec. 8, 1998.
ION Technology 7700 ION Installation & Operation Manual, Power Measurement, revision date Nov. 20, 1996, 148 pp.
Ion Technology 8500 ION. 8400 ION Advanced Socket-Mount Meter, specification, Power Measurement, pp. 1-12, revision date Dec. 3, 1999.
ION(R) Technology, Meter Shop User's Guide, (C)Power Measurement Ltd., Revision Date May 10, 2001, 48 pages.
Manual, "3300 ACM, Economical Digital Power Meter/Transducer—Installation and Operation Manual, Power Measurement, Ltd.", 1999, pp. 79.
Multi-port Communications Card (MPCC), Multi-port Ethernet Communications Card (MPE), Installation & Configuration Instructions, Power Measurement, pp. 1-9, rev. date Jul. 25, 1997.
Nagura et al., "Correction method for a single chip power meter", May 10-12, 1994, IEEE, 1994 IEEE Instrumentation and Measurement Technology Conference, 1994. ITMC/94, 4 pp.
Nexus 1250/1252 Installation and Operation Manual Revision 1.31, Electro Industries/Gauge Tech, 146 pages, Jan. 21, 2010.
Nexus 1500 Installation and Operation Manual Revision 1.03, Electro Industries/Gauge Tech, 124 pages, Jan. 4, 2010.
Power Platform 4300 Multi-DAQ TASKCard Operator's Manual; Dranetz-BMI, Original Issue—Jul. 2002, pp. 203.
Power Platform PP1 & PP1E TASKCard—Inrush Operator's Manual; Dranetz-BMI, Revision A—Apr. 15, 1997, pp. 231.
Ramboz, J.D. and Petersons, O., Nist Measurement Services: A Calibration Service for Current Transformers, U.S. Dept. of Commerce, National Institute of Standards and Tech., U.S. Gov. PMtg. Ofc., Jun. 1991, 63 pp.
Series 5500 InfoNode User's Gide; Dranetz-BMI, Edison, NJ; Copywright 1999, 2002, 2004; pp. 1-220.
The Dranetz Field Handbook for Power quality Analysis; Dranetz Technologies Incorporated, Edison, NJ; Copyright 1991; pp. 1-271.
Xu Hong, Wang Jianhua, "An Extendable Data Engine based on OPC Specification", Computer Standards & Interfaces 26 (2004) 515-525; Dec. 5, 2003.

\* cited by examiner

LOG HEADER FILE FORMAT

| | | |
|---|---|---|
| Number_records | 4 bytes | Number of records stored in this log. |
| Oldest_timestamp | 8 bytes | The timestamp of the oldest record. |
| Reserved | 4 bytes | |
| Oldest_external_index | 4 bytes | The external index of the oldest record. |
| Oldest_internal_index | 4 bytes | The internal index of the oldest record. |
| Newest_timestamp | 8 bytes | The timestamp of the newest record. |
| Reserved | 4 bytes | |
| Newest_external_index | 4 bytes | The external index of the newest record. |
| Newest_internal_index | 4 bytes | The internal index of the newest record. |
| Record_size | 4 bytes | The size of a record in bytes. All records must have the same size. |
| Memory_allocated | 4 bytes | Amount of memory allocated to this log, in bytes. |
| Valid_Bitmap | 8 bytes | Bitmap indicating the validity of each item in the log. Only useful for logs which contain an configurable number of items, such as Interval 1. |

FIG. 4

INTELLIGENT ELECTRONIC DEVICE FOR RECEIVING AND SENDING DATA AT HIGH SPEEDS OVER A NETWORK

PRIORITY

This application is a continuation application of U.S. patent application Ser. No. 12/061,979, filed on Apr. 3, 2008, now U.S. Pat. No. 9,080,894, which is a continuation-in-part application of U.S. patent application Ser. No. 12/036,356 filed on Feb. 25, 2008, now U.S. Pat. No. 7,899,630, which is a continuation application of U.S. patent application Ser. No. 11/341,802 filed on Jan. 27, 2006 entitled "METERING DEVICE WITH CONTROL FUNCTIONALITY AND METHOD THEREOF", now U.S. Pat. No. 7,337,081, which claims priority to U.S. Provisional Patent Application Ser. No. 60/647,669 filed on Jan. 27, 2005, the contents of which are hereby incorporated by reference in their entireties.

U.S. patent application Ser. No. 12/061,979, filed on Apr. 3, 2008, now U.S. Pat. No. 9,080,894 is also a continuation-in-part application of U.S. patent application Ser. No. 11/998,920 filed on Dec. 3, 2007, now U.S. Pat. No. 7,999,696, which is a continuation application of U.S. patent application Ser. No. 10/969,706 filed on Oct. 20, 2004 entitled "ON-LINE WEB ACCESSED ENERGY METER", now U.S. Pat. No. 7,304,586.

This application also claims priority to an application entitled "INTELLIGENT ELECTRONIC DEVICE WITH ENHANCED POWER QUALITY MONITORING AND COMMUNICATIONS CAPABILITIES" filed in the United States Patent and Trademark Office on Apr. 3, 2007 and assigned Ser. No. 60/921,651, and an application entitled "HIGH SPEED DIGITAL TRANSIENT TRIGGERING AND CAPTURE SYSTEM AND METHOD FOR USE IN AN INTELLIGENT ELECTRONIC DEVICE" filed in the United States Patent and Trademark Office on Apr. 3, 2007 and assigned Ser. No. 60/921,659, the contents of which are hereby incorporated by reference.

FIELD

The present disclosure relates generally to an intelligent electronic device (IED) and, in particular, to a system and method for sending/receiving data to/from the intelligent electronic device at high speeds over a network.

BACKGROUND

Monitoring of electrical energy by consumers and providers of electric power is a fundamental function within any electric power distribution system. Electrical energy may be monitored for purposes of usage, equipment performance and power quality. Electrical parameters that may be monitored include volts, amps, watts, vars, power factor, harmonics, kilowatt hours, kilovar hours and any other power related measurement parameters. Typically, measurement of the voltage and current at a location within the electric power distribution system may be used to determine the electrical parameters for electrical energy flowing through that location.

Devices that perform monitoring of electrical energy may be electromechanical devices, such as, for example, a residential billing meter or may be intelligent electronic devices ("IED"). Intelligent electronic devices typically include some form of a processor. In general, the processor is capable of using the measured voltage and current to derive the measurement parameters. The processor operates based on a software configuration. A typical consumer or supplier of electrical energy may have many intelligent electronic devices installed and operating throughout their operations. IED's may be positioned along the supplier's distribution path or within a customer's internal distribution system. IED's include revenue electric watt-hour meters, protection relays, programmable logic controllers, remote terminal units, fault recorders and other devices used to monitor and/or control electrical power distribution and consumption. IED's are widely available that make use of memory and microprocessors to provide increased versatility and additional functionality. Such functionality includes the ability to communicate with remote computing systems, either via a direct connection, e.g. modem or via a network. IED's also include legacy mechanical or electromechanical devices that have been retrofitted with appropriate hardware and/or software allowing integration with the power management system.

Typically an IED is associated with a particular load or set of loads that are drawing electrical power from the power distribution system. The IED may also be capable of receiving data from or controlling its associated load. Depending on the type of IED and the type of load it may be associated with, the IED implements a power management function that is able to respond to a power management command and/or generate power management data. Power management functions include measuring power consumption, controlling power distribution such as a relay function, monitoring power quality, measuring power parameters such as phasor components, voltage or current, controlling power generation facilities, computing revenue, controlling electrical power flow and load shedding, or combinations thereof. For functions which produce data or other results, the IED can push the data onto the network to another IED or back end server/database, automatically or event driven, or the IED can wait for a polling communication which requests that the data be transmitted to the requester.

The present disclosure is directed to a process of transferring data from an intelligent electronic device (IED) to external PC clients, via a network interface using the File Transfer Protocol (FTP).

File Transfer Protocol (FTP) is the standard application for transfer of files between computers attached to Transmission Control Protocol/Internet Protocol (TCP/IP) networks, including the Internet. FTP is a "client/server" application, such that a user runs a program on one computer system, the "client", which communicates with a program running on another computer system, the "server". The interface between the FTP client and server programs is officially defined by two Request For Comment (RFC) memoranda approved by the Internet Architecture Board of the Internet Society:

Postel, J. B., and Reynolds, J. K. "File Transfer Protocol (FTP)", RFC959, October, 1985.

Braden, R. (editor). "Requirements for Internet Hosts—Application and Support", RFC1123, October, 1989.

Normal operation of FTP requires the user to enter a user identifier and password for authentication on the server system. However, some system owners have the need to make some data files available as "public" data. To facilitate the transfer of such files, an informal protocol referred to in the art as "anonymous FTP" has been developed which allows a user to obtain data from an FTP server without requiring normal user identifier and password authentication. There is no formal specification of anonymous FTP, but the following informational RFC describes its use:

Deutsch, P., Emtage, A., and Marine, A. "How to Use Anonymous FTP", RFC1635, May, 1994.

Traditionally, IEDs would transfer data using serial based download commands. These commands would be accessed via an RS232, and RS485 or an Ethernet port encapsulating the serial request with an Ethernet message using any Ethernet protocol such as HTTP or TCP/IP. For instance, host software or a "master" would make a request for a set of data from one or more memory registers. At that point, the IED slave would then communicate the data stored in the memory registers back to the host software utilizing a serial transfer. This technology is inherently limited because host software traditionally is limited by the amount of memory registers that it would be able to accept at any one time. For example, if the serial based protocol is Modbus, a recognized industry standard protocol, most software master systems are limited by the protocol definition to 256 bytes of data that can be transferred at any one time. Thus, to pull large amount of data, many such requests would have to be sent to the meter repeatedly. This would create many delays due to processing and data traffic.

Accordingly, there is a need for a novel FTP based approach that overcomes the drawbacks associated with the afore-mentioned Master/Slave serial encapsulation techniques of the prior art.

SUMMARY

In accordance with embodiments of the present disclosure, there are provided herein methods and systems for improving a data transfer rate from an intelligent electronic device (IED) to external PC clients, via a network interface.

In accordance with an exemplary embodiment of the present disclosure, a system for transferring data from an IED to an external client files is provided which allows for significant optimization of download speeds, i.e., an improved data transfer rate, providing as much a 100 times the download speed capability over conventional data transfer approaches such as Modbus TCP. To provide optimized download speeds, the IED of the present disclosure is configured to include a server, such as a File Transfer Protocol (FTP) server, that includes a virtual command file processor configured to process virtual commands received from an external client. Virtual command files are FTP commands that are packaged or disguised as the names or data of files being accessed in a novel file system of the present disclosure. Upon receiving a virtual command file at an interface of the IED from an external client, the virtual command file is processed by the virtual command file processor to assume the form of an FTP command for accessing a novel file system of the IED having a PC file structure amenable to receiving such FTP commands in the same way that a conventional PC processes an FTP command. Accordingly, it will be shown that the combination of FTP server and novel file system of the IED provide for an improved data transfer rate of data requested by an external client.

The present disclosure improves the data transfer rate from an IED to external PC clients in a wide variety of different contexts, such as, for example, the remote access of system configuration information, power meter measurement data, and diagnostic data. The reader will be aware of other contexts.

In accordance with one aspect of present disclosure, an improved data rate is achieved by utilizing a high-speed transfer protocol, such as the FTP protocol in conjunction with a novel file system incorporated into the IED.

In accordance with one embodiment of the present disclosure, an intelligent electronic device (IED) is configured to include at least one internal FTP server and at least one FTP interface to an external network to facilitate high speed data transmission and retrieval with external PC clients over a network.

As will become apparent, the FTP server, associated interface and novel file system provide a host of benefits over the prior art, including, for example, high speed remote data access of files stored in the IED, access to virtual files stored in the IED, remote Log retrieval of Log files stored in the IED, externally configurable programmable settings and firmware updates of the IED, externally configurable programmed display configuration settings and web configuration settings, remote diagnostics, calibration and virtual command files.

According to one aspect of the present disclosure, the FTP server and interface facilitate the rapid retrieval of data Logs than would not otherwise be possible using a conventional retrieval approach, such as Modbus for example. Further, because the Log records are retrieved quicker via an FTP interface, larger files can also be supported within the IED. Still further, data Logs can be individually retrieved by a client via the FTP interface, including the Log headers and configuration.

According to another aspect of the present disclosure, programmable settings can be stored as files on an internal file system of the IED, and read in on boot up. These files can be easily overwritten by a client via the FTP interface, allowing direct configuration of the settings. Similarly, with respect to firmware, these modules can be stored on the internal IED file system and read in on boot up. Certain of the firmware modules can be upgraded by simply overwriting these modules by a client via the FTP interface with properly formatted updated firmware files.

According to a further aspect of the present disclosure, the look and feel of the screens of the IED touch-screen display are remotely configurable by a client via the FTP interface. In particular, screens, images, and text can be modified by uploading new files to the IED via the FTP interface. Similar capabilities exist for web page configuration. In particular, pages, images, and text can all be modified by uploading new files to the IED.

According to yet another aspect of the present disclosure, with respect to diagnostics and feedback, informational files can be created that allow a client, or automated software, to remotely gather information about the state of the IED. These files may be stored directly on a long term storage media within the IED, or otherwise stored on a less permanent basis as one or more virtual files.

According to a further aspect of the present disclosure, calibration of IED readings may be performed through a calibration file on an internal file system. Beneficially, this calibration file can be remotely read and modified by a client via the FTP interface. The act of reading a virtual file can be intercepted by the IED, and information artificially constructed and returned. The act of writing to a virtual file can be intercepted by the IED, and the written data passed directly to firmware's control.

BRIEF DESCRIPTION OF THE DRAWINGS

These and other objects, features and advantages of the present disclosure will be apparent from a consideration of the following Detailed Description considered in conjunction with the drawing Figures, in which:

FIG. 4 illustrates a log header file format, according to one embodiment.

DETAILED DESCRIPTION

Figure 1:
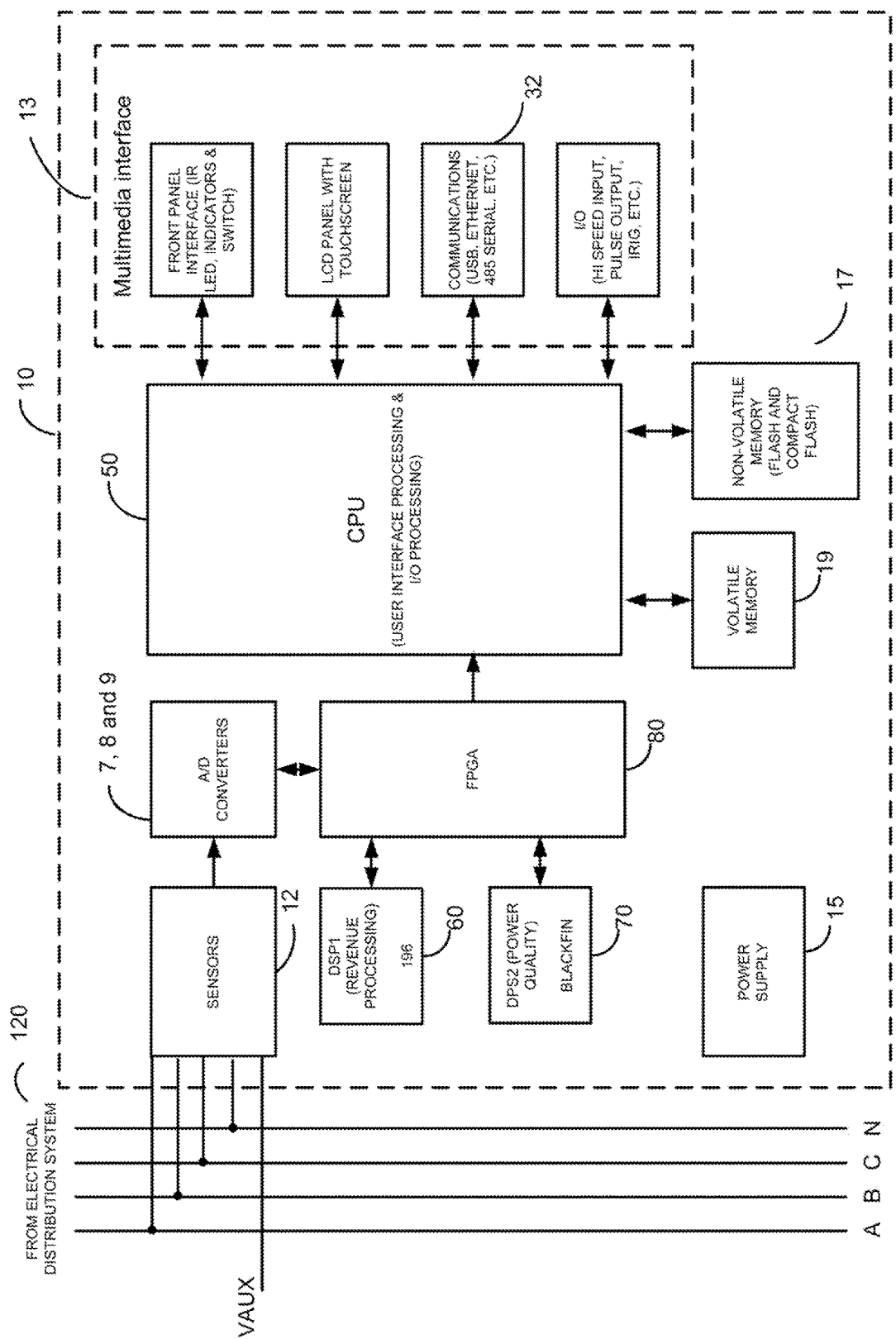
FIG. 1 is a block diagram of an intelligent electronic device (IED), according to an embodiment of the present disclosure.

Preferred embodiments of the present disclosure will be described herein below with reference to the accompanying drawings. In the following description, well-known functions or constructions are not described in detail to avoid obscuring the present disclosure in unnecessary detail. The word "exemplary" is used herein to mean "serving as an example, instance, or illustration." Any configuration or design described herein as "exemplary" is not necessarily to be construed as preferred or advantageous over other configurations or designs. Herein, the phrase "coupled" is defined to mean directly connected to or indirectly connected with through one or more intermediate components. Such intermediate components may include both hardware and software based components.

It is further noted that, unless indicated otherwise, all functions described herein may be performed in either hardware or software, or some combination thereof. In a preferred embodiment, however, the functions are performed by at least one processor, such as a computer or an electronic data processor, digital signal processor or embedded micro-controller, in accordance with code, such as computer program code, software, and/or integrated circuits that are coded to perform such functions, unless indicated otherwise.

It should be appreciated that the present disclosure can be implemented in numerous ways, including as a process, an apparatus, a system, a device, a method, or a computer readable medium such as a computer readable storage medium or a computer network where program instructions are sent over optical or electronic communication links. Several inventive embodiments of the present disclosure are described below.

Preferred embodiments of the present disclosure will be described herein below with reference to the accompanying drawings.

I—General Overview of an IED

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power that they are metering.

The present disclosure describes an intelligent electronic device (IED), e.g., a power meter, configured to split and distribute front end voltage and current input channels, carrying front end voltages and currents, into separate circuit paths (Revenue Measurement Circuit Path, Transient Detection and Measurement Circuit Path, and a Waveform Measurement Circuit Path) for the purpose of scaling and processing the front end voltages and currents by dedicated processors or processing functions. The present disclosure is particularly directed to the configuration and operation of the Transient Detection and Measurement Circuit Path.

FIG. 1 is a block diagram of an intelligent electronic device (IED) 10 for monitoring and determining power usage and power quality for any metered point within a power distribution system and for providing a data transfer system for faster and more accurate processing of revenue and waveform analysis.

The IED 10 of FIG. 1 includes a plurality of sensors 12 coupled to various phases A, B, C of an electrical distribution system 120, a plurality of analog-to-digital (A/D) converters 7, 8, 9, including inputs coupled to the sensor 12 outputs, a power supply 15, a volatile memory 19, an non-volatile memory 17, a multimedia user interface 13, and a processing system that includes at least one central processing unit (CPU) 50 (or host processor) and one or more digital signal processors, two of which are shown, i.e., DSP1 60 and DSP2 70. The IED 10 also includes a Field Programmable Gate Array 80 which performs a number of functions, including, but not limited to, acting as a communications gateway for routing data between the various processors 50, 60, 70, receiving data from the A/D converters 7, 8, 9 performing transient detection and capture and performing memory decoding for CPU 50 and the DSP processor 60. The FPGA 80 is internally comprised of two dual port memories to facilitate the various functions, as will be described further below.

The plurality of sensors 12 sense electrical parameters, e.g., voltage and current, on incoming lines, (i.e., phase A, phase B, phase C), from an electrical power distribution system.

A/D converters 7, 8, 9 are respectively configured to convert an analog voltage output to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 7, 8 and 9 (see FIG. 1) to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other programmable logic device in place of the FPGA 80. In some embodiments, the digital samples, which are output from the A/D converters 7, 8, 9 are sent directly to the CPU 50 or DSP processors 60, 70, effectively bypassing the FPGA 80 as a communications gateway.

The power supply 15 provides power to each component of the IED 10. Preferably, the power supply 15 is a transformer with its primary windings coupled to the incoming power distribution lines and having windings to provide a nominal voltage, e.g., 5 VDC, +12 VDC and −12 VDC, at its secondary windings. In other embodiments, power may be supplied from an independent power source to the power supply 15. For example, power may be supplied from a different electrical circuit or an uninterruptible power supply (UPS).

In one embodiment, the power supply 15 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 13 is shown coupled to the CPU 50 in FIG. 1 for interacting with a user and for communicating events, such as alarms and instructions to the user. The multimedia user interface 13 preferably includes a display for providing visual indications to the user. The display may be embodied as a touch screen, a liquid crystal display (LCD), a plurality of LED number segments, individual light bulbs or any combination. The display may provide information to the user in the form of alpha-numeric lines, computer-generated graphics, videos, animations, etc. The multimedia user interface 13 further includes a speaker or audible output means for audibly producing instructions, alarms, data, etc. The speaker is coupled to the CPU 50 via a digital-to-analog converter (D/A) for converting digital audio files stored in a memory 19 or non-volatile memory 17 to analog signals playable by the speaker. An exemplary interface is disclosed and described in commonly owned co-pending U.S. application Ser. No. 11/589,381, entitled "POWER METER HAVING AUDIBLE AND VISUAL INTERFACE", which claims priority to U.S. Provisional Patent Appl. No. 60/731,006, filed Oct. 28, 2005, the contents of which are hereby incorporated by reference in their entireties.

The IED 10 will support various file types including but not limited to Microsoft® Windows® Media Video files (.wmv), Microsoft® Photo Story files (.asf), Microsoft® Windows® Media Audio files (.wma), MP3 audio files (.mp3), JPEG image files (.jpg, .jpeg, .jpe, .jfif), MPEG movie files (.mpeg, .mpg, .mpe, .mlv, .mp2v .mpeg2), Microsoft® Recorded TV Show files (.dvr-ms), Microsoft® Windows® Video files (.avi) and Microsoft® Windows® Audio files (.wav).

The IED 10 further comprises a volatile memory 19 and a non-volatile memory 17. In addition to storing audio and/or video files, volatile memory 19 will store the sensed and generated data for further processing and for retrieval when called upon to be displayed at the IED 10 or from a remote location. The volatile memory 19 includes internal storage memory, e.g., random access memory (RAM), or removable memory such as magnetic storage memory; optical storage memory, e.g., the various types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including timestamps and stored digital samples for later downloading to a client application, web-server or PC application.

In a further embodiment, the IED 10 will include a communication device 32 for enabling communications between the meter module, and a remote terminal unit, programmable logic controller and other computing devices, microprocessors, a desktop computer, laptop computer, other meter modules, etc. The communication device 32 may be a modem, network interface card (NIC), wireless transceiver, etc. The communication device 32 will perform its functionality by hardwired and/or wireless connectivity. The hardwire connection may include but is not limited to hard wire cabling e.g., parallel or serial cables, RS232, RS485, Universal Serial Bus (USB) cable, Firewire® (1394 connectivity) cables, Ethernet, and the appropriate communication port configuration. The wireless connection will operate under any of the various wireless protocols including but not limited to Bluetooth™ interconnectivity, infrared connectivity, radio transmission connectivity including computer digital signal broadcasting and reception commonly referred to as Wi-Fi™ or 802.11.X (where x denotes the type of transmission), satellite transmission or any other type of communication protocols, communication architecture or systems currently existing or to be developed for wirelessly transmitting data including spread spectrum 900 MHz, or other frequencies, Zigbee®, WiFi™, or any mesh enabled wireless communication.

The IED 10 may communicate to a server or other computing device via a communication device 32. The IED 10 may be connected to a communications network, e.g., the Internet, by any means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any network that couples a plurality of computers to enable various modes of communication via network messages. Furthermore, the server will communicate using various protocols such as Transmission Control Protocol/Internet Protocol (TCP/IP), File Transfer Protocol (FTP), Hypertext Transfer Protocol (HTTP), etc. and secure protocols such as Hypertext Transfer Protocol Secure (HTTPS), Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

In an additional embodiment, the IED 10 will also have the capability of not only digitizing the waveform, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive said data in response to a polled request. The digitized waveform will also allow the CPU 50 to compute other electrical parameters such as harmonics, magnitudes, symmetrical components and phasor analysis. Using the harmonics, the IED 10 will also calculate dangerous heating conditions and can provide harmonic transformer derating based on harmonics found in the current waveform.

In a further embodiment, the IED 10 will execute an e-mail client and will send e-mails to the utility or to the customer direct on an occasion that a power quality event occurs. This allows utility companies to dispatch crews to repair the condition. The data generated by the meters are use to diagnose the cause of the condition. The data is transferred through the infrastructure created by the electrical power distribution system. The email client will utilize a pop3 or other standard mail protocol. A user will program the outgoing mail server and email address into the meter. An exemplary embodiment of said metering is available in U.S. Pat. No. 6,751,563 which all contents thereof are incorporated by reference herein.

The techniques of the present disclosure can be used to automatically maintain program data and provide field wide updates upon which IED firmware and/or software can be upgraded. An event command can be issued by a user, on a schedule or by digital communication that will trigger the IED 10 to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED 10 also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, or firmware, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

The IED 10 of the present disclosure can compute a calibrated VPN (phase to neutral) or VPP (phase to phase) voltage RMS from VPE (phase to earth) and VNE (neutral to earth) signals sampled relative to the Earth's potential. The desired voltage signal can be produced by subtracting the received channels, for example the phase to neutral voltage VPN=VPE−VNE. Calibration involves removing (by adding or subtracting) an offset (o, p) and scaling (multiplying or dividing) by a gain (g, h) to produce a sampled signal congruent with the original input signal.

RMS is the Root-Mean-Square value of a signal, the square root of an arithmetic mean (average of n values) of squared values. Properly combined, one representation of this formula is:

$$V_{AN} = \sqrt{\frac{\sum_n (g(V_{AE} - o) - h(V_{NE} - p))^2}{n}}$$

Implementation of the computation in this arrangement is comparatively inefficient, in that many computations involving constants (−o, −p, g, h) are performed n times, and that computational precision can either be minimized, forcing the use of large numbers (requiring increased memory for storage and increased time to manipulate), or be degraded, increasing the uncertainty. However, a mathematical rearrangement can be carried out on the above formula, producing an equivalent computation that can be carried out more efficiently, decreasing the effort needed to produce similar or superior results. That representation is:

$$V_{AN} = \sqrt{g^2\left(\frac{\sum_n V_{AE}^2 - 2o\sum_n V_{AE}}{n} + o^2\right) - 2gh\left(\frac{\sum_n V_{AE}V_{NE} - o\sum_n V_{NE} - p\sum_n V_{AE}}{n} + op\right) + h^2\left(\frac{\sum_n V_{NE}^2 - 2p\sum_n V_{NE}}{n} + p^2\right)}$$

Implementation of the computation in this arrangement can be accomplished with more efficiency and precision. All involvement of constants has been shifted to single steps, removed from the need to be applied n times each. This savings in computation can then be partially utilized to perform slower but more precise applications of the gains and Square Root. The result is a value of equal or higher precision in equal or lesser time.

These calculations are preferably implemented in software by at least one processor such as the CPU 50 or, in the alternative, by at least one DSP Processor 70 and at least one FPGA 80.

I. Key Features Incorporated into the IED for Improving the Data Transfer Rate The internal Log file system and associated method provide numerous advantages with regard to improving a data transfer rate from an IED incorporating said internal Log file system to external PC clients. These advantages are primarily, but not exclusively, achieved via the utilization of certain key features incorporated into the IED. These features are described here as follows.

Figure 2:
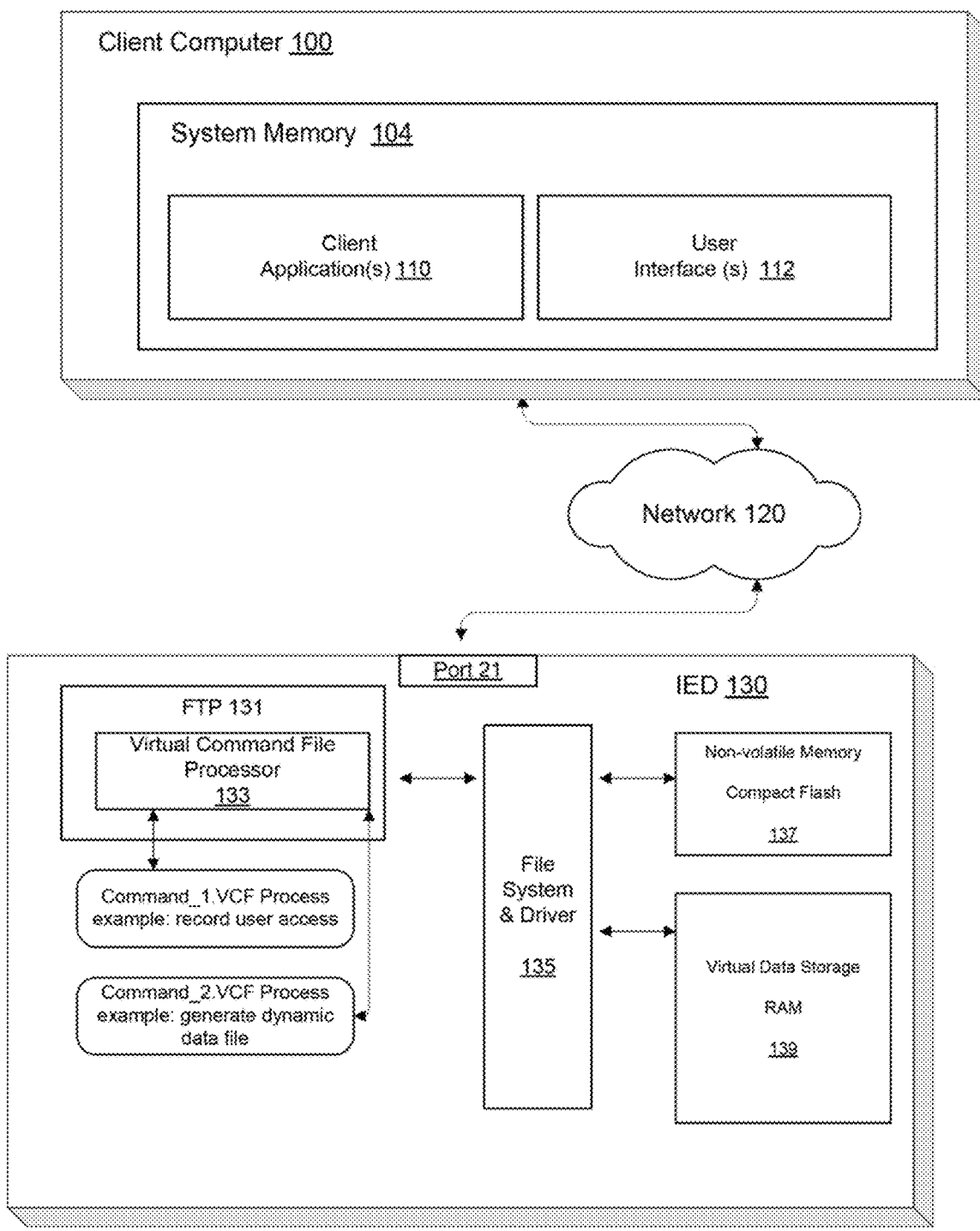
FIG. 2 illustrates an environment in which the present disclosure may be utilized.

II. Key Data Transfer Protocol Features for Improving the Data Transfer Rate To improve the speed of data transfers to and from an IED 130 as shown in FIG. 2, the present disclosure utilizes a protocol which is optimized for data transfer. The data transfer may be directed, for example, to Log Retrieval. A protocol which is optimized for data transfer can be defined as possessing the following features.

A transfer speed that is primarily limited by two factors, the bandwidth (i.e., data transfer capacity) of the media in question (e.g. the network bandwidth), and the capability of the IED 130 to fill that bandwidth.

The data transfer can continue while either the PC client 100 or the IED 130 is processing previously sent data. The sender does not require that the previous block be accepted by the receiver before sending the next block.

The percentage of information transferred for the protocol overhead (non-data-relevant information) is minimized, with only relevant data transferred being an optimal situation. In practice, few protocols are optimized in this area as much as possible, as it degrades reliability.

The FTP protocol can be described as one example of a data-optimized protocol, as it meets each of the aforementioned criteria, while still retaining enough overhead to maintain data and message reliability.

The key features of FTP which support FTP being a data-optimized protocol include:

Data is transferred in a stream: When data is requested from the FTP Server (a file), that data is transferred by the sender to the receiver (server to client) as a stream of data blocks, with little additional handshaking being done by either side until all the data has been sent, or the transfer is cancelled.

Minimal Handshaking: The only handshaking being done is at the beginning and end of the data transfer session, and the handshaking of the TCP protocol which contains the FTP protocol. This satisfies condition 3, as the TCP overhead is approximately 40 bytes for every 1000 bytes of data transferred.

Rapid Data Transfer: Data is transferred by the sender as rapidly as possible: The sender transmits data blocks in the data stream as fast as it is capable of, without waiting for a response from the receiver before sending the next block. If the device is fast enough, this can easily reach the limit of the media's bandwidth. This satisfies both conditions 1 and 2.

Other key features of FTP include:

Server Process: FTP operates as a server process. In a multi-process environment, this allows it to operate concurrently with other communications processes, such as Modbus TCP servers, DNP servers, Email Servers, or Web Servers.

File System Access: An FTP Server gives access to the files on the file system of the device which hosts the Server.

An example of a non-data-optimized protocol using a network interface is Modbus TCP. Modbus TCP is a common query response protocol which is adaptation of Modbus RTU for use in a TCP environment. Modbus TCP is a serial transaction protocol, meaning that for each transaction (request) the sender must wait for the receiver to respond, or time out, before sending the next request. This seriously limits the throughput (bandwidth usage) of the protocol. Additionally, Modbus TCP which is based off of Modbus RTU, has a limitation of 254 bytes of data for the standard read and write requests. Again, this limits the overall throughput, as TCP supports up to 1500 bytes per packet: it also hurts the header to data ratio, as the TCP header averages 40 bytes per packet, so with only 254 bytes of data per message, it is less efficient then FTP for data transfer even though it uses the same media.

An additional performance advantage of FTP as a data optimized protocol is that it uses a flexible data format which allows the contents of the file transfer to be compressed for more efficient data transfers versus fixed message based protocols such as Modbus TCP which do not support compressed data transfers III. Configuring the Log File System to Optimize Performance and Reliability A series of benchmark tests were performed on compact flash from various manufacturers. As a result of these tests a number of factors which are listed below were found to effect performance and/or reliability. The effect of these factors on the performance and/or reliability were found to be either a function of the Real-Time Operating System (RTOS) and File System or due to the structure and functional limitations of compact flash technology. These factors are applicable to all RTOS and File systems and memory storage devices. Based upon the test results the configuration of the Log File system of the present disclosure is structured so as to optimize performance and reliability.

a. Restricting the Number of Directories of an Internal File System.
    b. Restricting the Number of Files of an Internal File System.
    c. Restricting the Number of records for inclusion in Files of the internal File System.
    d. Restricting the location of the Files of the internal File System.
    e. Utilizing a specific File Naming Format for the Files of the Internal File System.
    f. Utilizing a specific File Naming Convention for the Files of the internal File System.
    g. Minimizing the number of overwrites of one sector of a File Storage System of the internal File System.
    h. Maximizing the number of records written to the File Storage System of the internal File System in a single write operation.
    i. Maintaining the Files of the internal File System in an open state.
    j. Minimizing File creation and deletion.
    k. Minimizing directory creation and deletion of the Internal File System.
    l. Log Initialization.
    m. Utilizing Low Level File Access Methods.

(a) Restricting the Number of Directories of an Internal File System

Based on the series of benchmark tests, discussed above, it was determined that the performance of the internal Log File system and compact flash access significantly decreases as the number of Directories increase. In other words, there is an inverse relationship between the number of directories and the performance of the internal Log File system. Accordingly, the internal Log file system of the present disclosure is preferably structured as a flat file system. In other words, all log files of the internal Log file system are located in a single directory.

(b) Restricting the Number of Files of an Internal File System

Based on the series of benchmark tests, described above, it was determined that the performance of the File system and compact flash access significantly decreases as the number of files increase. Benchmarks were taken for different numbers of files and an optimum number of files for the internal Log File system was found which is also optimized to take into account the size of each file, the number of records and the size of the records for maximum performance.

In one embodiment, for a 1 Gigabyte compact flash it was found that fixing the file size to 1 Megabyte and allocating 800 files for the Logs was an optimum configuration for the internal Log file system. It is understood that other configurations are within contemplation of the present disclosure if new functionality is added to the IED. Similarly based upon the size of the memory storage device and type, the configuration can be modified for optimum performance.

A benchmark of the FTP performance as a function of the number and size of the files was also performed and the configuration described above (i.e., fixing the file size to 1 Megabyte and allocating 800 files for the Logs) was found to be optimum. It was determined that if the file size is small and consequently many small files need to be transferred, the overhead of the FTP in addition to finding, opening and closing the file severely degrades performance.

(c) Restricting the Number of Records for Inclusion in Files of the Internal File System Based on the series of benchmark tests, described above, it was determined that the number of records in a file is also a significant factor in the performance of the internal Log File system of the present disclosure. Specifically, as the number of records per file increases the performance decreases. Specific benchmark test were performed and an optimum records per file versus file size was found for the Log implementation described above.

(d) Restricting the Location of the Files of the Internal File System

Two factors that significantly effect performance are the relative physical file location of the log files and fragmentation of files as records are added and the file grows larger. By restricting the relative location of the files it is possible to optimize the access performance of the file system by having the log files adjacent to each other on the storage media. In one embodiment, this is achieved by performing a low level format of the media or compact flash and then allocating the log files adjacent to each other on the storage medium. To guarantee that the log files remain adjacent, the log files are never physically erased. For a description of log file initialization and reset refer to section 3.12 on Log Initialization.

Fragmentation occurs when a file grows in size and can no longer fit in its initially allocated area. When this happens new records for the file have to be stored somewhere else on the media which adversely affects the access time for writing and retrieving file records. To prevent fragmentation and ensure that the log files remain adjacent, the log files are made fixed in size and when the fixed size file becomes full it writes over the oldest stored record so that the log files are circular buffers. The large size of the compact flash and the log file allocation size also ensures that sensitive data is not overwritten before it can be downloaded from the IED 130.

(e) Utilizing a Specific File Naming Format for the Files of the Internal File System In one embodiment the IED uses a file system compatible with the FAT32 file system developed by Microsoft Corporation, Redmond, Wash. FAT32 supports two file name formats. Either an 8.3 filename format which allows a filename of eight characters with three character extension name or a Long File Name (LFN) format which allow file names up to 255 characters long. Based on the series of benchmark tests, described above, it was determined that the LFN format seriously decreased performance of the file system. Accordingly, to enhance performance of the IED file system, all files stored in the IED 130 conform to the 8.3 file-naming format. In accordance with the 8.3 format, filenames consist of up to 8 characters for the directory filename, plus 3 characters for the extension, for a total of 11 characters. When files are created which do not match this naming convention, they become inaccessible to the FAT32 file system. When uploading files, a FTP client, e.g., PC client 100, must be used which properly detects the 8.3 convention, and renames the uploaded files correctly.

(f) Utilizing a Specific File Naming Convention for the Files of the Internal File System It should be appreciated that using short filenames requires the smallest number of entries in a file allocation table (FAT), thus significantly reducing the space required for storage, and reducing the amount of time required to update entries in the table (i.e., file allocation and de-allocation).

Based on the series of benchmark tests, described above, it was determined that the internal Log file system utilizes a numeric file naming convention. The log files are named with sequentially incrementing numbers. For example, by way of example and not limitation, 000000000.bin, 000000001.bin, 000000002.bin . . . 000000799.bin. Each Log is comprised of one or more contiguous files. By using generic numeric names for the log files, it is easy and efficient to directly calculate the location and name of the file for any particular Log based upon the size of each of the Logs, thus further enhancing the performance of the internal Log file system.

(g) Minimizing the Number of Overwrites of One Sector of a File Storage System of the Internal File System In one embodiment, Compact Flash is utilized as a long term storage medium. The size of the compact flash should be sufficiently large so as to minimize the number of overwrites of any particular sector of the File Storage System thereby increasing the reliability of the internal Log file system. The use of a large compact flash which has significant free space also improves file access performance. Thus utilizing a compact flash in an IED design in which the IED is allocated to store less than half of the available space in the compact flash is desirable due to the fact that based on empirical study, performance standards can be improved.

It should be understood that the present disclosure is not restricted to any particular storage technology, such as compact flash technology, as discussed above. The present disclosure is more broadly applicable to both magnetic drive and flash based technology. Non-limiting examples of these technologies include, without limitation, Smart Media®, Sony Corporation type Memory Stick® devices, USB micro-drives and flash drives, NOR Flash, NAND Flash, magnetic hard drives, flash drives etc.

(h) Maximizing the Number of Records Written to the File Storage System of the Internal File System in a Single Write Operation Based on the series of empirical benchmark tests, described above, it was determined that when writing small records, which are smaller than a compact flash sector, performance is seriously degraded. It was further determined that maximum performance is achieved if multiple sectors on the compact flash are written to at one time.

In one embodiment, to achieve maximum performance, intelligent RAM based buffering is implemented so that records are accumulated and written in groups to the compact flash unless there is no Log activity for a period where the write time to compact flash will not effect the real-time performance of the system. In those cases where there is a great amount of Log activity, the grouping of records and buffering significantly improves performance of the internal Log File System.

(i) Maintaining the Files of the Internal File System in an Open State.

Based on the series of benchmark tests, described above, it was determined that keeping a file open after an access in preparation for another access will enhance performance which the internal Log File system will take advantage of when appropriate.

(j) Minimizing File Creation and Deletion

Based on the series of benchmark tests, described above, it was determined that deletion and creation of files in a file system was found to be one of the most time intensive functions of the internal Log File System which could impair real-time performance. To overcome this limitation, it is contemplated to implement the internal Log File System with a fixed number of files of a fixed size so that no log files are ever created or deleted. In other words, instead of erasing files to reset Logs, Logs are instead re-initialized, as described in section 3.12, so that log files do not have to be deleted or created except after a low level format of the storage medium (e.g., compact flash) which is performed by the factory and in user operation.

(k) Minimizing Directory Creation and Deletion of the Internal File System.

Based on the series of benchmark tests described above, it was determined that creation and deletion of directories in a file system were found to be one of the most time intensive functions of the internal Log File System which could impair real-time performance. In one embodiment, the implementation of the internal Log File System has all log files in a single directory with a fixed number of Log files, of a fixed size, whereby these Log files are never deleted or created. Accordingly, there is never a need to create or delete Log directories, thereby optimizing performance of the internal Log File System.

(l) Log Initialization.

As discussed above, log file creation is performed after a low level format of the non-volatile memory 137 (e.g., compact flash drive) so that the log files are stored contiguously in the non-volatile memory 137. As the log files are created they are marked as empty as described below when a log file is reset.

In one exemplary embodiment, for a 1 gigabyte compact flash, the number of log files created is 800, each having a fixed size of 1 megabyte. Accordingly, the total memory space occupied by the log files is 800 megabytes. In such an embodiment, Log files are fixed in size (e.g., 1 megabyte) independent of the size of the records that are stored in each log. That is, there is no restriction on record size in a given log file, which is user defined. However, the number of records multiplied by the record size must be less than or equal to the size of the Log file.

A user may define the size of a record in a Log file. Once determined, each record written to the log file has the same size. In accordance with a wrap-around feature, when a last record of a log file is written to, the next record to be written to in the Log file is the first record of the Log File.

In one embodiment, the size of a log file, which is determined during a low level formatting, can only be increased thereafter by a user during log file creation, in increments of 1 megabyte. (i.e., the pre-determined file size).

In accordance with the present exemplary embodiment, in normal operation, once the log files are created (i.e., Log Initialization is complete), thereafter, these newly created log files are permanent. In other words, the log files are never deleted or increase/decreased in size. Only the contents of the log files can change. Such a change could occur if an initialization or reset of the Logs is performed or if the contents of sections related to the Log configuration in the programmable settings have been changed. These sections related to Log configuration in the programmable settings include but are not limited to: (1) Record size, (2) Log memory allocation, (3) Current Transformer (CT) and Potential Transformer (PT) Ratios, and (4) Items assigned to the Log.

Further, the user can reset any one log file or alternatively a set of log files. To perform a reset of the Logs a special record number is reserved to indicate that a file is empty. All records start with a record number which is a sequential number that is incremented every time a record is written. The hexadecimal record number 0xFFFFFFFF is reserved to indicate that a file is empty when it is written in the first location of a file.

When a log reset is performed all files allocated to the log will be reset. In operation, a value of 0xFFFFFFFF is stored in only the first 4 bytes of the files to be reset. Efficiencies are achieved by only clearing the first 4 bytes instead of clearing or deleting the entire record. In the case where the first record of a log file has been marked it indicates that all other records of that log file may be overwritten.

Another aspect of log initialization is identifying the location of the oldest and most recent records written to each of the Logs so that the Logs can be properly updated. Upon power up of the IED, a check of the each of the Logs is performed to find the location of the oldest and most recent record written to the log so that the firmware can identify the location of the next record to be written to the log file and verify the integrity of the log (i.e., the sequence of record numbers are correct).

Locating the next record to be written to a log file may be implemented in one way by reading the first record of each file and finding the last non-empty file (i.e., a file that is not marked with 0xFFFFFFFF in the first four bytes). The system then performs a binary search of the identified unmarked records, in the log file to find the oldest and the most recent record written based upon the record number. Of course, search algorithms other than a binary search may be used. The oldest and most recent written record identification information is stored in RAM for performance reasons since it is constantly being read and updated. The system preferably does not store this information in non-volatile memory (e.g., compact flash) but chooses instead to re-create this information on power up and upon a system reset, as an integrity check of the system.

(m) Utilizing Low Level File Access Methods.

The log file implementation where all the log files are contiguous and there are a fixed number of log files with each of the log files of fixed size directly lends itself to allow without complication the use of the low level access commands of the compact flash by passing the performance overhead of using a file system which supports very high real-time performance of the IED IV. System Overview FIG. 2 illustrates an exemplary environment in which the present disclosure may be practiced. The network 120 may be the Internet, a public or private intranet, an extranet, or any other network configuration to enable transfer of data and commands. An example network configuration uses the Transport Control Protocol/Internet Protocol ("TCP/IP") network protocol suite, however, other Internet Protocol based networks are contemplated by the present disclosure. Communications may also include IP tunneling protocols such as those that allow virtual private networks coupling multiple intranets or extranets together via the Internet. The network 120 may support existing or envisioned application protocols, such as, for example, telnet, POP3, Mime, HTTP, HTTPS, PPP, TCP/IP, SMTP, proprietary protocols, or any other network protocols. During operation, the IED 130 may communicate using the network 120 as will be hereinafter discussed.

The PC client 100 may comprise any computing device, such as a server, mainframe, workstation, personal computer, hand held computer, laptop telephony device, network appliance, other IED, Programmable Logic Controller, Power Meter, Protective Relay etc. The PC client 100 includes system memory 104, which may be implemented in volatile and/or non-volatile devices. One or more client applications 110 which may execute in the system memory 104. Such client applications may include, for example, FTP client applications. Additionally, user interfaces 112 may be included for displaying system configuration, retrieved data and diagnostics associated with the IED 130.

The intelligent electronic device (IED) 130, in one embodiment, is comprised of at least an FTP Server 131 including a Virtual Command File Processor 133, a File System and Driver 135, a non-volatile memory 137 and a virtual data store 139. Of course, the IED 130 may contain other hardware/software for performing functions associated with the IED, however, these functions are not relevant to the present application and will therefore not be further discussed.

IED 130 runs the FTP Server 131 as an independent process in the operating system, allowing it to function independently of the other running processes. Additionally, it allows for multiple connections, using the port/socket architecture of TCP/IP.

By running the FTP Server 131 as an independent process, this means that other systems, such as the Modbus TCP handler, can run on IED 130 concurrently with the FTP Server 131. This also means that multiple FTP connections can be made with the only limitation being the system's available resources.

The FTP Server 131 provides access to the file system 135 of the IED 130 on the standard FTP port (port 21). When a connection is made, PC client 100 sends a FTP logon sequence, which includes a USER command and a PASS command. The PC client 100 then interacts with the IED 130, requesting information and writing files, ending in a logout. This connection protocol is discussed in more detail in Request For Comments, RFC0959, which is incorporated by reference herein in its entirety.

The FTP Server 131 uses two ports for all actions. The first port 21, is a clear ASCII telnet channel, and is called the command channel. The second port, which can have a different port number in different applications, is initiated whenever it is necessary to transfer data in clear binary, and is called the data channel.

The virtual data store 139 is an ideal storage medium for files that are written to very frequently, such as, for example, status information, diagnostics, and virtual command files. In contrast to these types of files are files which require more long term storage, such as, for example, Logs, settings, and configuration, a more suitable to be stored using a compact flash drive.

The File Transfer Protocol (FTP) (Port 21) is a network protocol used to transfer data from one computer to another through a network, such as over the Internet. FTP is a commonly used protocol for exchanging files over any TCP/IP based network to manipulate files on another computer on that network regardless of which operating systems are involved (if the computers permit FTP access). There are many existing FTP client and server programs. FTP servers can be set up anywhere between game servers, voice servers, internet hosts, and other physical servers.

FTP runs exclusively over TCP. FTP servers by default listen on port 21 for incoming connections from FTP clients. A connection to this port from the FTP Client forms the control stream on which commands are passed to the FTP server from the FTP client and on occasion from the FTP server to the FTP client. FTP uses out-of-band control, which means it uses a separate connection for control and data. Thus, for the actual file transfer to take place, a different connection is required which is called the data stream. Depending on the transfer mode, the process of setting up the data stream is different.

In active mode, the FTP client opens a dynamic port (49152-65535), sends the FTP server the dynamic port number on which it is listening over the control stream and waits for a connection from the FTP server. When the FTP server initiates the data connection to the FTP client it binds the source port to port 21 on the FTP server.

To use active mode, the client sends a PORT command, with the IP and port as argument. The format for the IP and port is "h1,h2,h3,h4,p1,p2". Each field is a decimal representation of 8 bits of the host IP, followed by the chosen data port. For example, a client with an IP of 192.168.0.1, listening on port 49154 for the data connection will send the command "PORT 192,168,0,1,192,2". The port fields should be interpreted as p1×256+p2=port, or, in this example, 192×256+2=49154.

In passive mode, the FTP server opens a dynamic port (49152-65535), sends the FTP client the server's IP address to connect to and the port on which it is listening (a 16 bit value broken into a high and low byte, like explained before) over the control stream and waits for a connection from the FTP client. In this case the FTP client binds the source port of the connection to a dynamic port between 49152 and 65535.

To use passive mode, the client sends the PASV command to which the server would reply with something similar to "227 Entering Passive Mode (127,0,0,1,192,52)". The syntax of the IP address and port are the same as for the argument to the PORT command.

In extended passive mode, the FTP server operates exactly the same as passive mode, however it only transmits the port number (not broken into high and low bytes) and the client is to assume that it connects to the same IP address that was originally connected to. Extended passive mode was added by RFC 2428 in September 1998, incorporated herein by reference in its entirety.

The objectives of FTP, as outlined by its RFC are to promote sharing of files (computer programs and/or data), to encourage indirect or implicit use of remote computers, to shield a user from variations in file storage systems among different hosts and to transfer data reliably, and efficiently.

A key feature of the present disclosure is the ability provided an external PC client 100 with an improved data transfer rate when making data download requests of data stored within an IED. This is achieved by configuring the IED 130 to include an FTP server 131 including a Virtual Command File Processor 133. An improved data transfer rate from the IED 130 may be realized by the external PC client 100 issuing virtual commands to the IED 130. In response, the IED 130 process the received virtual commands in the Virtual Command File processor 133 to construct FTP commands therefrom to be applied to a novel file system 135 of the IED 130, coupled to the FTP server 131, wherein the novel file system 135 is configured as a PC file structure amenable to receiving and responding to the constructed FTP commands. The Virtual command files and the novel file system 135 are discussed in greater detail below.

While FTP file transfer comprises a preferred embodiment for encapsulating files to improve a data transfer rate from an IED to external PC clients, the present disclosure contemplates the use of other file transfer protocols, such as the Ethernet protocol such as HTTP or TCP/IP for example. Of course, other Ethernet protocols are contemplated for use by the present disclosure. For example, for the purpose of security and firewall access, it may be preferable to utilize HTTP file encapsulation as opposed to sending the data via FTP. In other embodiments, data can be attached as an email and sent via SMTP, for example.

With specific reference to HTTP file encapsulation, an HTTP encapsulation layer is typically found within the protocol stack of an operating system of a PC client 100. This layer corresponds and communicates with a HTTP server in the IED 130 protocol stack.

When a request is received from a PC client 100 or data is transmitted to the PC client 100 from the IED 130, both the request and the data are encapsulated prior to transmission. Upon being received at its destination, the HTTP encapsulation is then stripped and the request or data is then passed through to the PC client 100 or IED 130.

The HTTP Headers form the core of an HTTP encapsulated request, and are very important in an HTTP response. They define various characteristics of the data that is requested or the data that has been provided. HTTP headers are defined in RFC 2611 for HTTP/1.1, incorporated by reference herein in its entirety.

V. Virtual Command Files

Virtual command files are commands that are packaged as the names or data of files being accessed (e.g., FTP files), and can be used to readily implement new functionality into an IED, while still using an existing communications media (such as FTP). In operation, when a virtual command file is opened, an event is raised to the firmware's file system handler, which recognizes the file as a virtual command file. An event is then raised to other parts of the internal file system to execute the command specified in the virtual command file.

The Virtual Command File can be processed in multiple ways. Three exemplary ways are described as follows.

The name of the file accessed can contain the data being sent to IED 10, and optionally data returned to the client as the file contents. Actions are then taken as a function of the name of the file, parameters possibly being extracted from the path and file name used. This file accessed does not have to actually exist in IED 10's file system.

The contents of the Virtual Command File are processed after the file has been written to. This requires that the file actually exist, either in non-volatile memory, or in a Virtual File.

Instead of the file being written to or read from directly, the data contained in the virtual command file is passed directly to the command's handler. This allows the data is created as the file is accessed, which allows the returned contents to be customized for each port/socket, which standard file access does not support. This file accessed does not have to actually exist in IED 10's file system.

Some non-limiting examples of virtual command files include:

Resets: Logs, features, or the device itself could be reset when specific files are opened. Additional security could include writing a password to the file as verification.

Virtual Readings: A virtual file which contains all of the readings from the IED, and only needs to be updated when that file is read.

Virtual communications: Communications protocols which have been implemented for other communications media (Modbus RTU via RS485, Modbus TCP, etc.) can be used via the Virtual Command Files. The implementation of the protocol via the Virtual Command Files could be, but is not limited to, embedding the fields of the protocol in the names of the files.

Communications Buffer: A virtual file which acts as a virtual communication buffer, mimicking an actual COM port so that the data contained in the virtual command file is processed as if it was coming from a communication port. Reads and writes are processed the same way as with a COM port, and data is communicated using the same protocols (Modbus, etc.).

Data Streams: a small file which acts as an incrementing window to a larger block of data. Each read of this file provides the next sequential block of data from the source block of data. The source of the data may be another file, a block of memory, or generated upon request.

State Control: The internal processing state of IED 10 can be modified as a result of specific file accesses. For example, access to specific files could signal the beginning and end of a log retrieval session.

Logging Access: When any file is accessed, a log of those actions can be kept for security and administrative purposes.

Data Encryption: The data read from and written to a file can be modified such that it transparently provides encryption on the data stored on the device. This is useful for files on the compact flash, as the compact flash can be removed and accessed from any card reader. This can be further extended using File Redirection, as described below.

Data Modification: The data read from and written to a file can be modified such that it is customized to the current state of the device, and to the requestor's current state. This includes providing individual responses to each FTP connection, perhaps in conjunction with a network diagnostic request.

File Redirection: When a file is accessed, the file which is actually opened can be redirected to another file, or group of files (given a location in the file). This allows for long term obfuscation of the location and contents of files to unsecured users (ie. Direct compact flash access, uncontrollable by IED 10), while still remaining transparent to the security controlled user (access through FTP).

VI. FAT32 File System

With continued reference to FIG. 2, the IED 130 provides client computer 100 with access to data configured in the IED 130 in a FAT32 formatted file system 135. The FAT32 file system 135 is configured to store files including but not limited to: Logs, configuration, diagnostics and system files In some embodiments, the FAT32 formatted file system 135 is spread across two or more drives. In the presently described embodiment, the FAT32 formatted file system is spread across, a non-volatile memory 137 (e.g., compact flash drive), and a virtual data store 139 (i.e., virtual drive (RAM)). The FTP server 131 is provided access to all directories in the FAT32 formatted file system.

VII. Logs

Figure 3:
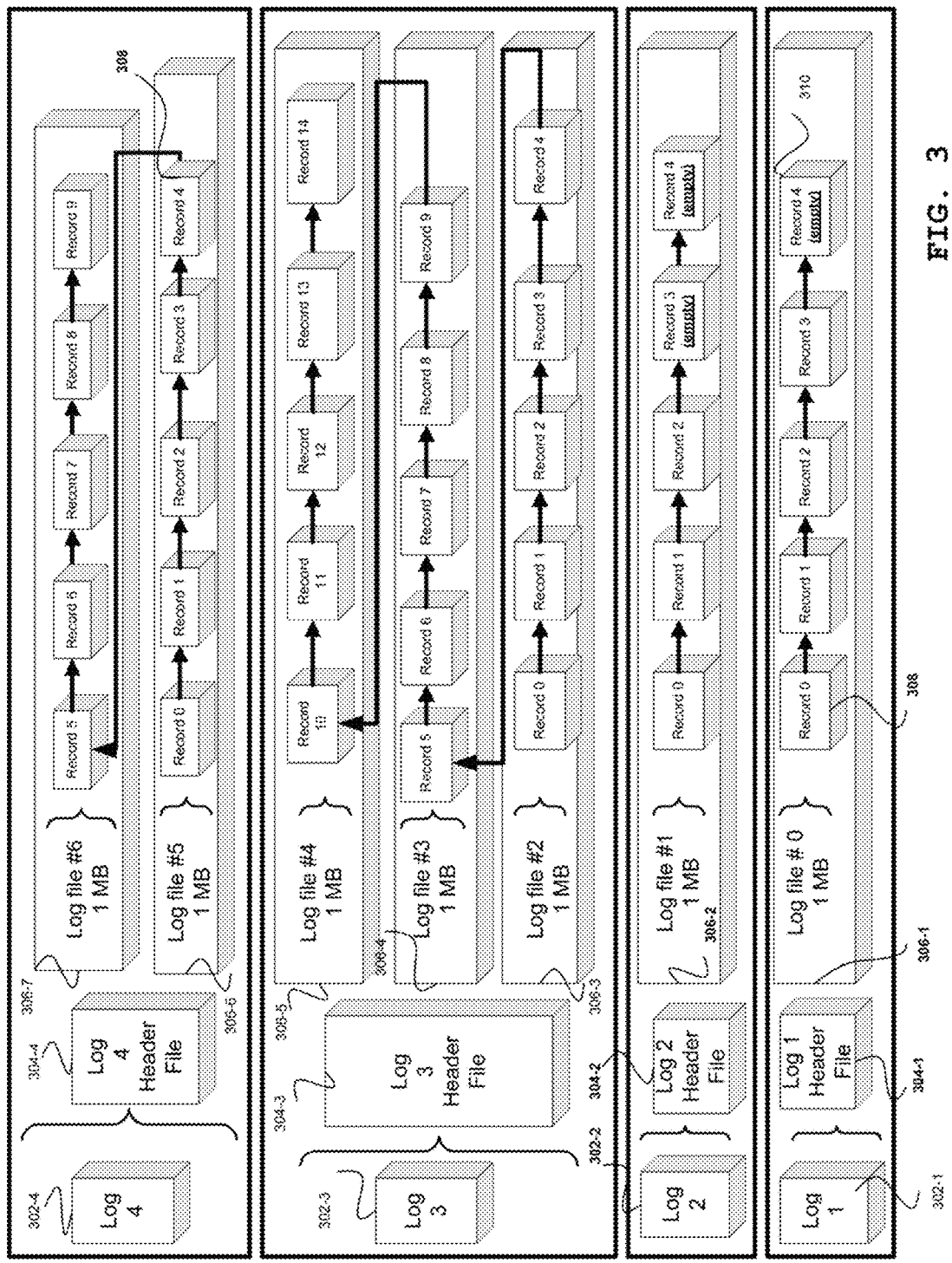
FIG. 3 illustrates an exemplary configuration of an internal Log system, according to one embodiment.

Referring now to FIG. 3, there is shown an exemplary configuration of an internal Log system 300 according to one embodiment. The Log system 300 is comprised, by way of example only, of four Logs (Logs 302-1 to 302-4) allocated contiguously in the non-volatile memory 137 (compact flash) in a single directory, structured as a flat file system. Each Log 302 of the Log system 300 is comprised of a single Log header file (304-1 to 304-4), and one or more log files 306. The number of log files 306 per Log is user defined. In the exemplary configuration of the presently described embodiment, Log 1 includes a single log file (i.e., log file #0), Log 2 includes a single log file (i.e., log file #1), Log 3 includes three log files (i.e., log files #2-#4), and Log 4 includes two log files (i.e., log files #5-#6).

The Logs 302 are allocated in the non-volatile memory 137 during a low level formatting procedure. Also, during low level formatting, the log files 306 are allocated to be of a fixed size. In the presently described embodiment, as illustrated in FIG. 3, the size of the log files 306 in Log system 300 are of a fixed size equal to 1 MB.

In an exemplary application, the IED 130 allocates 800 MB of space in the Log system 300 for storing Logs which are divided into 800 log files, where each log file is of a fixed size, i.e., 1 MB. For a 1 Gig non-volatile memory size, it is apparent that 80% of the memory or 800 MB of space is allocated to the Logs with the remaining 20% of memory or 200 MB used for system operation.

VII-1 Log Header

As stated above, each Log 302 of the Log system 300 is comprised of a single Log header file (304-1 to 304-4). With reference now to FIG. 4 there is shown a log header file format, according to one embodiment. As shown, the log header file format is comprised of a total of 60 bytes.

In general, Log header files 304 contain statistics on each of the individual log files 306, including, for example, oldest and newest records, number of records, record sizes, and memory allocated. Those skilled in the art are aware of other types, or additional, statistics that can be stored in the Log header files 304. A Log header file's primary use is to determine the validity of data in Log retrieval from an external PC client 100, and for finding the position of each record in the log files 306. One header file 304 is created for each Log 302 to be preferably stored in a virtual file. Log header information are preferably stored in virtual files to reduce the wear on the non-volatile memory 137 (e.g., compact flash), as these files need to be written to on each update of a Log 302, which may occur multiple times a second.

Table I lists some commonly used log header files, with a description of each below.

TABLE I

| | |
|---|---|
| -INT1.bin: | Interval 1 log header. |
| -INT2.bin: | Interval 2 log header. |
| -INT3.bin: | Interval 3 log header. |
| -INT4.bin: | Interval 4 log header. |
| -INT5.bin: | Interval 5 log header. |
| -INT6.bin: | Interval 6 log header. |
| -INT7.bin: | Interval 7 log header. |
| -INT8.bin: | Interval 8 log header. |
| -ET.bin: | Event Triggered log header. |
| -LIMIT.bin: | Limit log header. |
| -DIGIN.bin: | Digital Input log header. |
| -DIGOUT.bin: | Digital Output log header. |
| -FLICKER.bin: | Flicker log header. |
| -SYSEVENT.bin: | System Event log header. |
| -WAVEFORM.bin: | Waveform log header. |
| -TRANS.bin: | Transient log header. |
| -PQ.bin: | Power Quality (PQ) log header. |

The Interval 1 log (Historical 1), is capped at 8 log files or 8 MB. The Interval 1 log is backwards compatible, requiring 32000 records or less. If more space is allocated, the log will automatically cap itself at 32767 records. The Interval 1 record has an adjustable size, based on the number of snapshot items configured. This size is always a power of 2, up to 256 bytes.

The Interval 2 log (Historical 2), is capped at 8 log files or 8 MB. The Interval 2 log is backwards compatible, requiring 32000 records or less. If more space is allocated, the log will automatically cap itself at 32767 records. The Interval 2 record has an adjustable size, based on the number of snapshot items configured. This size is always a power of 2, up to 256 bytes.

The Interval 3 record contains a timestamp followed by n log items, called snapshots. The size of the record is the sum of the timestamp (8 bytes) and the size of all of the log items.

The Interval 4 through Interval 8 logs are the same as the Interval 3 log. The Event Triggered log is the same as the Interval 3 log.

The Digital Input record of the Digital Input Log contains the Digital Input details, followed by n log items, taken from the limit profile. The size of the record is the sum of the details and all the log items.

The Digital Output record of the Digital Output Log contains the Digital Output details, followed by n log items, taken from Interval 1's profile. The size of the record is the sum of the details and all the log items.

The flicker record of the Flicker Log.

The System Event log is fixed at 1 log file in size to be backwards compatible with Modbus log retrieval. The System Event is the first log, as the System Event log should never be reset. If it was later in the sequence, any changes to the configuration of the other logs would require that the relative position of the log be changed, thus invalidating the file.

Waveform records of the Waveform Log can be configured up to 1.4 MB in size, but due to the 1 MB file size, waveforms must be kept to less then 1 MB in size. To keep to this restriction, sampling rates of greater then 128 (256, 512, and 1024) have a reduced maximum number of cycles. The waveform record contains a record header, which describes the contents of the waveform. Following this is the samples for each channel, followed by the RMS data blocks for each cycle.

The Transient record of Transient Log contains the same information as the PQ record, plus 1572 samples (apx. 1.5 cycles) of waveform data.

PQ Log—The PQ Record of the PQ Log contains PQ information, followed by the RMS data block for the cycle that triggered the event.

VII-2 Log Records

With continued reference to FIG. 3, each log file 306 is shown to be made up of a number of Log records 308, where each record 308 being of a particular record length or size (e.g., M bytes). Each record 308 in a given log file 306 is packed towards the start (beginning) of the log file 306, such that the Ith record 308 in the log file 306 is located (M*I) bytes from the beginning of the log file 306.

VII-3 Log Record Format

In one embodiment, each record in a log is composed of two parts: A record header, and a record data part. The record header is 8 bytes in length, and contains the internal index for this record, and the adjusted timestamp delta.

Records can sometimes be recorded up to a second after they were triggered for recording. This can result in a record timestamp which is not when it was expected to be. For interval logs, the timestamp of each record is adjusted to the proper interval: This is done to support record parsing which requires that the record timestamps be when they are expected to be.

To maintain the accuracy of the timestamps, a timestamp delta is also stored, which gives the number of milliseconds which the timestamp was adjusted.

The record data part is unique to each log.

VII-4 Log File Format

In the Log file system 300 shown in FIG. 3, Log 1 302-1 includes a single log file #0 306-1 with a space allocation for five records of size M1. As shown, log file #1 306-1 presently stores four records with a space allocation for five. In other words, one record is an empty record 310. Similarly, Log 2 302-2 includes a single log file #1 306-2 having a space allocation for five records of size M2. As shown, log file 1 306-2 presently stores three records with a space allocation for five records.

With continued reference to FIG. 3, Log 3 302-3 includes 3 log files, namely, log file #2 (306-3), log file #3 (306-4) and log file #4 (306-5), each having a space allocation for 5 records of record size M3. The log files #2 (306-3) and #3 (306-4) are shown to be at capacity (i.e., each storing a maximum of five records. The log file #4 (306-5) is shown have a similar capacity for storing five records but presently stores three records of size M4.

Log 4 includes 2 log files, log file #5 (306-6) and log file #6 (306-7), each having a space allocation for five records of size M5. Presently, log file #5 (306-6) and log file #6 (306-7) store a maximum number of records (e.g., five).

It should be appreciated that the record size M can vary from Log to Log. That is, the respective record sizes, as described above, M1-M5, can be different in each of the Logs 302-1 through 302-4. Also, it should be understood that the exemplary embodiment describes a Log system 300 comprising four Logs 302 by way of example only. It is appreciated that the number of Logs 302 is not determined by the user but is instead a function of the firmware version. It should further be appreciated that a portion of the memory space of a log file may go unused. For example, assuming that the total number of records R that can be stored in a log file 306, multiplied by the respective record length M, (R*M), is calculated to be less than the user-specified memory allocation for the log file, e.g., 1 MB, at a point in time at which the log file is filled to capacity (i.e., cannot store any more records) any remaining unused space is ignored with the next sequential record being placed at the beginning of the next sequential. Therefore, when a log file is said to be filled in the manner described, the next record to be stored in the Log is rolled over, i.e., stored as the first record in the next sequential log file, or in the case where there is only a single log file, the record is stored as the first record of the same log file effectively over-writing the previously written oldest stored record. For example, in the case of log file #0 of Log 1, records are written in the order of record 0, record 1, record 2, record 3, record 4, record 5, record 0, record 1, and so on in circular fashion.

In general, when a record 308 is written to a log file 306-x, it is placed directly after the previously written record in the log file 306. If writing the entire record 308 would exceed the upper memory boundary of the log file 306-x and push the record 308 off the end of the log file 306-x, then the record is started at the beginning of the next log file 306-x+1.

Each Log 302 can be allocated an arbitrary number of files, allowing a user a configurable number of records to be stored in each file. Each of these individual files which make up a Log 302 is capable of being retrieved via the FTP interface, along with Log configuration and status information. This is described below on the section pertaining to Log Retrieval. By processing these files internally within the IED 130, Log records can be extracted to an external FTP client, i.e., PC client computer 100, and converted.

When all files allocated for a particular Log 302 have been written to, the number of records equals the max number of records, and the Log 302 is considered full. At this point, the Log "rolls over", and the next record is written at the beginning of the first log file associated with that particular Log. Logging then continues from that point in the files, overwriting old records.

Figure 5:
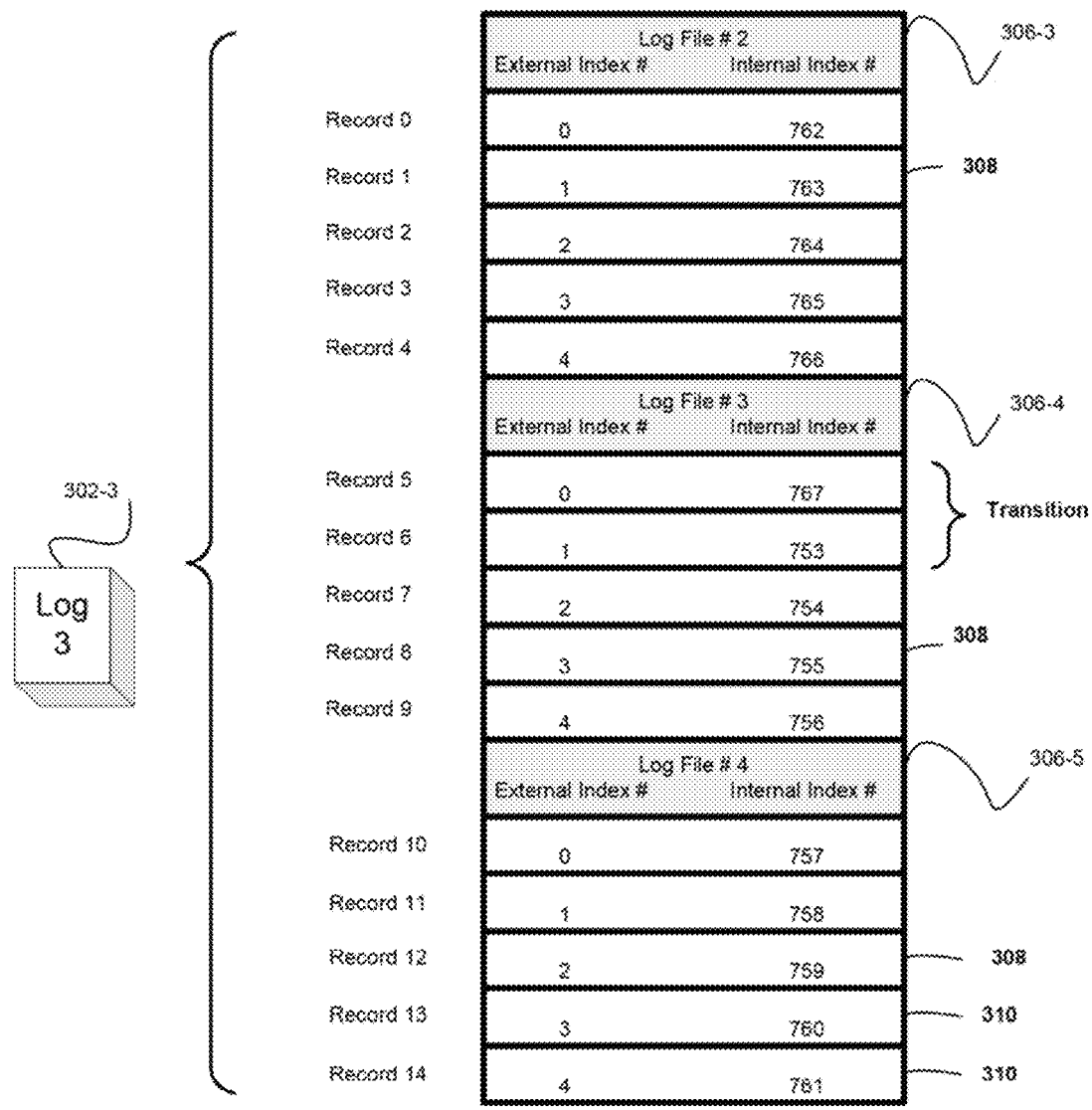
FIG. 5 illustrates the storage file system 300 of FIG. 3 highlighting the indexing feature, according to one embodiment.

This is described by way of example with reference to FIGS. 3 and 5. Referring now to FIG. 3, as one example, when log file #2 306-3 of Log 3 302-3 is filled to capacity (i.e., a maximum of 5 records is presently stored therein), the next record R to be stored in Log 3 is stored as the first record of log file #3 306-4. Continuing with this approach, when log file #3 306-4 is filled to capacity (i.e., a maximum of 5 records are presently stored therein), the next record R to be stored in Log 3 is stored as the first record of log file #4 306-5. In the same manner, when log file #4 306-5 is filled to capacity, the next record R to be stored in Log 3 is stored as the first record of log file #2 306-3 in wrap-around fashion.

In general, the record size M for a given Log 302, and the log files 306 that make up the Log 302 is fixed during low level formatting to be of a certain size. However, the record size M may vary from Log to Log. For example, the record size for the records R 308 of Log 1 302-1 may be different from the record size M of Log 2 302-2. In general, Log records 308 are formatted specific for each Log 302. However, the overall size of each log file 306 is generic across all Logs 302.

VII-5 Log File System Layout

In a preferred embodiment, the Logs of Storage File System 300 are stored in 800×1 MB files, referred to herein as log files 306, (e.g., log files 0-6 as shown) Each Log 302 is made up of one or more log files 306 allocated contiguously in the non-volatile memory 137 in a single directory. It should be understood that in other embodiments, the Logs 302 may be stored in files having quantities and sizes other than 800×1 MB, with the only restriction being the capacity of the non-volatile memory 137.

VII-6 Log Reconfiguration

In those cases where a Log Reconfiguration is performed, the location of any Log can shift in the non-volatile memory 137, with the new position being computable as a sum of the Log sizes which precede the Log in the non-volatile memory 137 in the new configuration.

VII-7 Log Record Location

To determine the location (record number or record index) of any record R 310 in any Log 302, three values need to be determined—(1) The Offset of First log file in the Log in which the record of interest is stored, (2)—the number of records stored within the log file of interest, and (3) the log file # associated with a particular record R1 in the Log in which the record of interest is stored

VII-7-1 Offset of First Log File

The first value corresponds to the offset of the first log file 306 in the Log in which the record R 310 is stored. This is computed as the sum of all the Log sizes before it.

$$\text{Offset of first log file of Log } X = \Sigma \text{size}(\text{Log } X-1) + \text{size}(\text{Log } X-2) + \ldots \text{size Log}(0) \quad \text{Eq. [1]}$$

For example, if it is desired to locate record 10 of Log 3 (i.e., X=3), then the sum of the sizes of all the preceding Logs, namely, Logs 2, 1 and 0 must first be computed in accordance with equation (1) above.

VII-7-2 Number of Records Stored within the Log File of Interest

The second value that is required to be computed to determine the location of any record R 310 in any Log 302 is the number of records stored within the log file of interest. This is computed as:

$$\text{\# Records in a log file} = \text{log file size/record size } (M) \quad \text{Eq. [2]}$$

where information pertaining to the record size is obtained from the Log Header file 304 for the Log in question.

VII-7-3 the Log File # Associated with a Particular Record R1 in the Log in which the Record of Interest is Stored In accordance with the present example, The log file # associated with a particular record R1 in a Log may be computed as:

$$\text{log file \#} = 1^{st} \text{ log file \#} + \text{INT part of } (R1/(\# \text{ of Records in a log file})) \quad \text{Eq. [3]}$$

Where the offset to the first log file # is calculated using Eq. (1) and the # of Records in a log file is calculated using Eq. (2).

Compute Record Number (Index)

The record number or record index of record R1 within the log file may be computed as:

$$\text{Record number within log file} = \text{Remainder of } (R1/(\# \text{ of Records in a log file})) \quad \text{Eq. [4]}$$

It is noted that the Log sizes are configured in the Programmable Settings.

VII-8 Log Indexing Systems

In one n embodiment, two indexing systems are used for each Log 302. The two indexing systems are referred to herein as an external indexing system and an internal indexing system.

Referring now to FIG. 5, the storage file system 300 of FIG. 3 is shown here highlighting the indexing feature of the present disclosure. As shown, each record of the storage file system 300 is assigned an internal index and an external index. Both indexing systems are described as follows.

VII-8-1 External Indexing

External indexing is used as a physical index in the log files. Each record of the Log file system 300 is assigned both an external index identifier and an internal index identifier. For example, referring now to Log 3 302-3 of FIG. 5, it is shown to be comprised of three log files, log file #3 306-3, log file #4 306-4 and log file #5 306-5. Log file #3 306-3 is comprised of 4 records. The first record, record 0 has an internal index of 762 and an external index of 0. The external index is used only to locate a record's position in a log file. It does not serve to uniquely identify records as they are reset or overwritten. In other words, the external index provides no information on the sequential nature of the records. This is accounted for by the Internal index, described below, which accounts for Log reset conditions and Log roll-over conditions. In these cases where the Log rolls over or the Log is reset, only the internal index provides information regarding these actions.

VII-8-2 Internal Indexing

Internal indexes are used to preserve the sequential nature of the records of a Log. In contrast to the External index, the internal index is not reset when a Log rolls over or is reset. Thus, the internal index uniquely identifies each record from every other record of a Log. Each record 310 in a Log 302 is given a sequentially increasing index, regardless of Log roll-over as described above, time changes, resets, or any other Log affecting event. This number is in the range of 0 to 231, giving relative uniqueness across the lifetime of the Log. This internal index becomes a part of the Log record R. As one example, referring to FIG. 5, Log 3 rolls over with the introduction of a new record. The most recently written record is assigned an internal index of 767 and an external index of 0. The next record to be written to Log 3 will overwrite the oldest existing record (e.g., external index 1/internal index 753) with a new "roll over" record assigned an external index of 1 and an internal index of 768.

VII-9 Log Retrieval

Log Retrieval from the IED 10, initiated by a PC client 100, is performed preferably using the FTP transfer protocol. However, in some embodiments, the IED 10 also supports Modbus Log retrieval for retrieving Legacy Logs.

For purposes of data transfer speed and efficiency records are preferably stored in contiguous blocks, broken across 1 MB files. This requires that a PC client 100 have meta-knowledge about the internal layout of these files in the File System 135 of the IED 10, the size of the records, and the positioning of these records, before the correct files can be retrieved.

Figure 6:
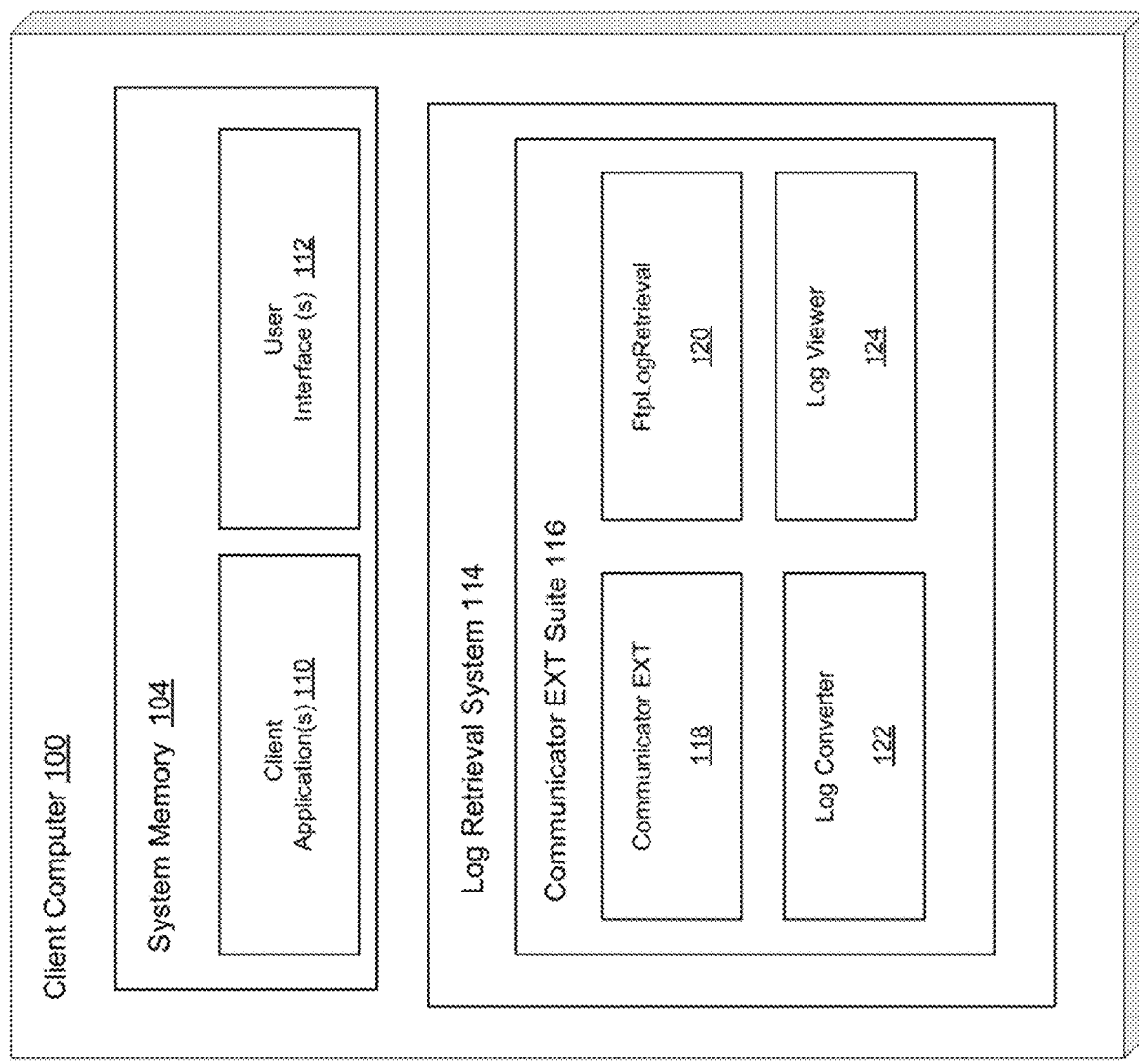
FIG. 6 illustrates a PC client computer including a Log Retrieval System, as implemented by the Communicator EXT Suite, according to one embodiment.

Referring now to FIG. 6, there is shown PC client computer 100, including system memory 104, one or more client applications 110 and user interfaces 112, as described above. In FIG. 6 PC client computer 100 is also shown to include Log Retrieval System 114, as implemented by the Communicator EXT Suite 116, comprising four applications: Communicator EXT 118, FtpLogRetrieval 120, Log Converter 122, and Log Viewer 124, described as follows. More detailed information can be found about the Communicator EXT Suite 116 in communicator EXT 3.0 user manual, E107707, publication date Aug. 27, 2007, V. 1.32 incorporated by reference herein in its entirety.

The Communicator EXT 118 provides the front end, giving the user a central place to view the status of the logs, and determine when to retrieve those logs. When the user requests that a log be retrieved, Communicator EXT 118 determines if any records have been retrieved before from the log database. If any records have been retrieved, a partial log retrieval is requested for that log; if not, then all records are requested. Communicator EXT 118 calls FtpLogRetrieval 120 with the list of logs to retrieve.

FtpLogRetrieval 120 encapsulates the log retrieval process described above, and returns the success or failure of each log retrieved through a ReturnStatus file, whose name is specified by Communicator EXT 118. A Device Master Log is created at the device root folder, which acts as the device's center point. While FtpLogRetrieval 120 is running, Communicator EXT 118 continues to monitor the program, waiting for it to finish. When FtpLogRetrieval 120 exits, if the exit code is ok, it then checks the ReturnStatus file.

Log Converter 1120—For each log which was retrieved successfully, it's .nbl file is passed to Log Converter to be converted to a log database.

Once all log conversions are finished, if all of the logs were successfully retrieved, Log Viewer 124 is launched with the .dml file, which automatically opens Log Viewer 124 to the logs of the device just retrieved.

VII-10 Log Storage

The output of Log Retrieval is stored in the "Retrieved Logs" directory, wherein each file is segregated for ease of visual search. In one embodiment, a root directory, Root, is the Retrieved Logs directory. Other directories may be used in different embodiments. Within the root directory, a folder is created for each device. This folder's name is [meter_designation]_[serial_number]. The logs folder contains each of the individual logs in a sub-directory called Log Root. Each log gets its own Log folder, having the same name as the Log. This folder contains the log database, which is the output of the conversion process. A /CSV folder stores the csv output of the log retrieval process. This provides data tracing, debugging, and in the case of waveform and transient, data storage. It is understood that CSV is a comma separated value method of storing data. It is contemplated to use other forms of storage such as, for example, Microsoft® Excel®, ASCII, XML. Other forms of storage are now apparent to the reader. The nbl output of log retrieval is placed in the /nbl folder. Each log retrieval produces an nbl file, for log conversion: however, for tracing purposes a unique copy is kept as backup. The binary output of log retrieval is placed in the /dump folder. A binary file is created for each retrieval, and contains an exact copy of the binary data extracted from the file retrieved via FTP.

As each record in a log is parsed during retrieval, a csv debug log of the contents of that record is generated. For all logs except waveform and transient, each row of the file is a record. Waveform and transient, which contain too much data to be stored on one line, are special cases, and store each record in its own file. Each block of waveform information is stored in the csv file, with the header and DSP RMS blocks starting the file, displayed in tag-value pairs per line. Samples are displayed with each channel in a column, and sample index per row, forming a 2d grid of values. The RMS data blocks, used for timing, follow the Samples. Finally, an analysis of the waveform data is displayed at the end of the file. This csv file is used to store the sample data for the waveform, as the data is too large to store in the database. Each block of transient information is stored in the csv file, with the header and DSP RMS data block starting the file, displayed in tag-value pairs per line. Samples are displayed with each channel in a column, and sample index per row, forming a 2d grid of values. The RMS data blocks, used for timing, follow the Samples. This csv file is used to store the sample data for the transient, as the data is too large to store in the database. The binary files in the /dump directory contain an exact copy of the binary data taken from the original files during log retrieval. As the nbl files contain parsed data, that information may have changed or stripped:

The binary file provides direct access to the original. The Device Master Log is the root point of the device, and is stored at root\device_root\[meter_designation]_[serial_number].dml. It contains a copy of the MeterID file, but may be extended to contain any amount of information required. It is used by a Log Viewer as the central point for the viewing of logs.

Figure 7:
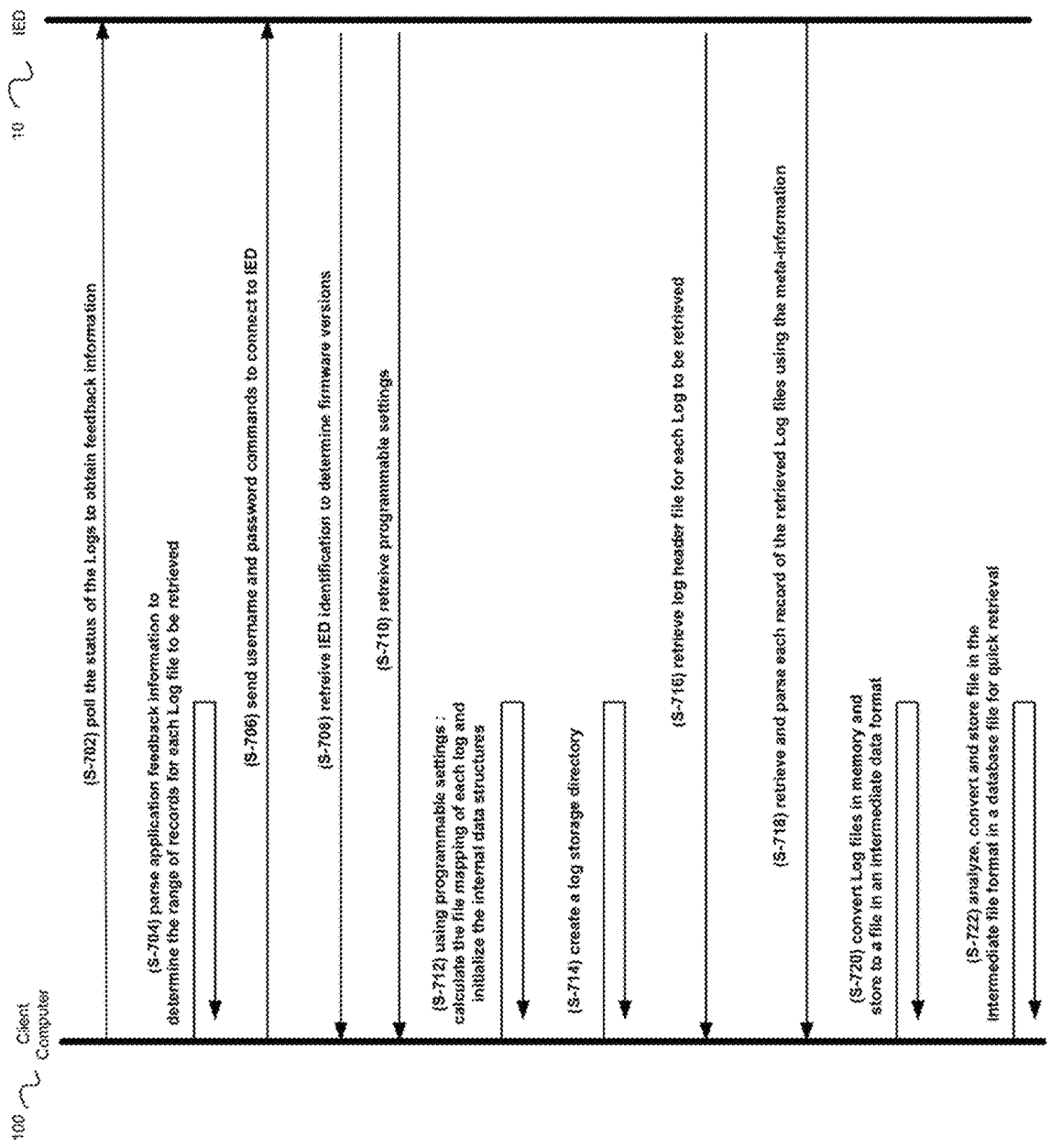
FIG. 7 illustrates a process for performing Log retrieval of Logs stored in a storage file system of an IED, according to one embodiment.

With reference now to FIG. 7, there is shown a process 700 for performing Log retrieval of Logs stored in a storage file system of an IED, whereby the Log retrieval is executed remotely from a retrieving PC client 100, in accordance with an embodiment of the present disclosure.

At step 702, the PC client 100 polls the status of the Logs to provide a user with feedback about the current state of the logs. Polling may be conducted in a number of ways, including but not limited to Modbus.

At step 704, the feedback about the current status of the logs is parsed to determine a range of records to be retrieved for each log. In the case where it is determined from the Log status that a Log has no new entries or if a Log has zero entries, it is unnecessary to download the Log At step 706, in a single log retrieval session, the IED 10 is only connected to once. To connect to the IED 10, the FTP port is opened, e.g., FTP port 21, and the username and password commands are sent from the PC client 100. In one embodiment, the username and password used are "anonymous".

At step 708, once connected, the IED identification is retrieved by a retrieving PC client 100 to determine the firmware versions. The firmware versions are used to determine supported features. The IED identification is used as the name of the directory in which files are to be stored.

At step 710, PC client 100 retrieves the Programmable Settings file which are stored in the non-volatile memory 137 (e.g., compact flash) of IED 10.

At step 712, using the programmable settings, calculate the file mapping of each log. The file mapping is the association of what files belong to which Logs and where to find each record within those files. Additionally the internal data structures which parse the records are initialized. This is a low level software operation that generally involves placing the different types of data/information of the Log record into specific data segments of a data structure, which are specifically allocated to accommodate the different data fields.

At step 714, the retrieved meter identification consists of the meter designation and the meter serial number which is used to create a log storage directory at the PC client 100. Given a directory to store all logs in, a folder is created for the device, with the name "meter designation_serial number". It should be understood that the meter designation is defined by the customer and the serial number is assigned at the factory.

At step 716, for each Log 302 to be retrieved from the IED 10, a corresponding Log Header file is first retrieved to determine the layout of the records in the files, and the size of the records for parsing. If an error is found in the conditions of the Logs 302, then log retrieval is stopped for that Log, and retrieval continues with the next log. Error conditions may include, for example: "no records are available", "the range of records is invalid", or other errors which may be found in the Log Header. Once the layout of the records 306 in the Log files 302 has been determined, the actual log file records 306 can be retrieved.

At step 718, using the information retrieved in previous steps, each of the records 308 of the Log files 306 are retrieved. The Log Header is used to determine the desired records and the files which contain those records. If the record to retrieve is contained within a file that has already been retrieved, then that file is used to process the record. If the file has not yet been retrieved, then that file is retrieved via FTP, and the created local file is used to process the record.

At step 720, the Log records are parsed from the files retrieved in the previous step. In one embodiment the records are then stored in an intermediate data format for conversion. By storing the data to an intermediate file format, the records can be analyzed at a later date, without requiring the meta-information acquired during retrieval.

In one embodiment the intermediate data formats used are comprised of three file formats:

Nexus Binary Log (NBL)—The NBL file contains the records of the Log to be converted as well as the additional meta-information acquired during Log retrieval. This allows the records to be converted at a later date without being connected to IED 10. The NBL contains information about the creator the file, information about IED 10, the Log Header for the Log retrieved and the records for the Log retrieved, as shown in FIG. 8.

CSV—During retrieval the parsed records are exported to a CSV file (Comma Separated Value) in human readable format for debugging and reporting.

Binary Log Records—In addition to storing the Log records in the NBL file and exact copy of the records from IED 10 are stored locally for diagnostic purposes.

At step 722, the Log records are converted and then stored in a Log database analyzing them for correctness of time and format. Log conversion generally comprises unpacking the data in the retrieved data records and separating the unpacked data into data fields which are formatted based the Programmable Setting file in preparation to being stored into a Log database file for easy access. In one embodiment a file in an intermediate data format is passed on to a log conversion process, which converts the records and stores then in a Log database.

VIII Other Embodiments

In accordance with another embodiment, drawbacks associated with downloading records from a Log while concurrently writing to the Log at its maximum capacity are overcome. Whenever records are downloaded to a PC client 100 while a Log is being written to (a logging process is being performed) certain records of the Log may be inadvertently overwritten resulting in records being unintentionally out of order, or even corrupt. This is an undesirable situation. In the embodiments to be described below, solutions are provided to avoid this undesirable situation.

Figures 8A, 8B, 8C:
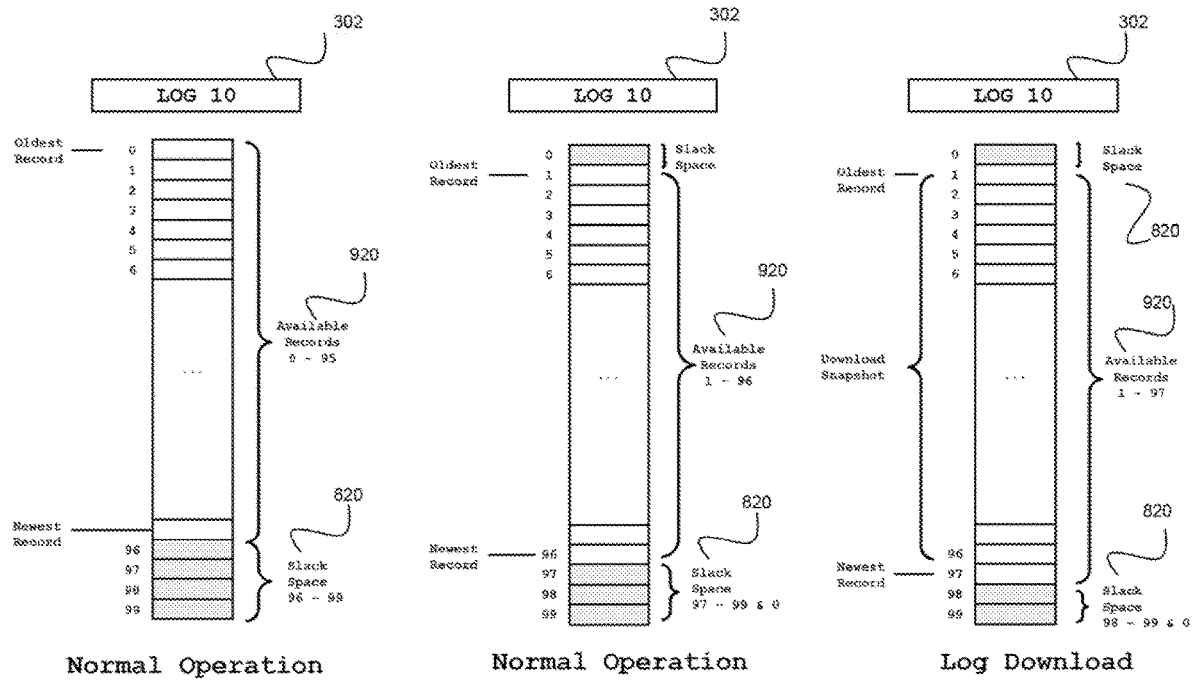
FIG. 8A illustrates an exemplary configuration of an internal Log according to one embodiment.
FIG. 8B illustrates another exemplary configuration of an internal Log according to one embodiment.
FIG. 8C illustrates another exemplary configuration of an internal Log according to one embodiment.

With reference now to FIG. 8a, there is shown a Log 10 302 generally divided into a number of available records 920 and a number of dedicated records 820, the dedicated records 820 being referred to herein as "slack space" 820. In the instant example, the available records 920 comprise 96 records in the range (record 0-record 95). The the slack space 820 comprises records 4 records in the range (record 96-record 99) 820. The record ranges are dynamic in the sense that the record boundaries shift during normal operation, as will be described.

It should be understood that the particular record ranges and record counts described are by way of example only. In general, the number of records that comprise the so-called slack space 820 is user defined and is typically some percentage (e.g., 5-20%) of the total number of records in the Log 10 302. In the instant example, the slack space comprises 4% (4/100) of the total number of records in Log 10 302.

It should be appreciated that the records of the slack space 820 serve a special function. As will be described, these records are not utilized in the same manner as the available records 920, which are written to and read from in the normal course of operations, as described in the immediately preceding embodiment. In particular, slack records 820 are not written to or read from during normal operations of the IED 10 but are instead held in reserve for use whenever a Log, such as Log 10 302, incurs a download request by a PC client 100.

Recall from the previous embodiment, that in a normal operation, prior to a Log, such as Log 10 302, for example, reaching its maximum storage capacity of 96 records, records are written to the Log in sequential order starting with record 0 (the first and therefore oldest written record) and continuing in sequence to record 95 (the latest or newest written record). When the Log 10 302 reaches its maximum capacity (i.e., Log 10 302 has consumed all of its available records 0-95) the next record to be written to Log 10 302 overwrites the first (oldest) record 0 in a so-called "roll-over" process, as described above. Briefly restated, the roll-over process relates to the case where all files allocated for a particular Log have been written to, and the Log is considered full. At this point, the Log "rolls over", and the next record is written at the beginning of the first log file associated with that particular Log. Logging then continues from that point in the files, overwriting old records.

In the instant example, the first (oldest) record is record 0 and will become the first record to be overwritten (i.e., rolled-over) when Log 10 302 is at capacity at 96 records. However, one undesirable consequence of performing roll-over of Log 10 302 is that this process can occur at the same time as records are being retrieved (i.e., downloaded) by an external PC client 100. This can result in certain records of Log 10 302 being inadvertently overwritten resulting in certain records being unintentionally out of order, or even corrupt. It should be understood that the inadvertent overwriting of records only occurs when a Log, such as Log 10 302 is at capacity, otherwise, new records are written to existing empty records in Log 10 302 while old records are being downloaded.

In one embodiment, a method for preventing the inadvertent overwriting of records when the overlap condition arises is to freeze Log 10 302 from receiving any new records while a PC client 100 download is in progress. This is desirable from the perspective of not overwriting existing records. However, it is also undesirable in that the new records to be written to Log 10 302 are irretrievably lost during the freeze-out stage (e.g. 1 minute, 2 minutes). Nevertheless, the downloaded records are maintained in such an embodiment.

In accordance with another embodiment, reference is now collectively made to FIGS. 8a-8e, where there is shown, by way of example, a method for circumventing the inadvertent overwriting of records to a Log at capacity, during a download process.

I. Normal Operation (No External Client Download Request)

Referring now to FIG. 8a, a normal operation of Log 10 302 is described utilizing the slack space 820 of the present embodiment. Normal Operation refers to the state where there is no overlap of reading/writing to the Log 10 302. The overlap state is described further below with reference to FIGS. 8c-8e.

During normal operation, Log 10 302 is shown to be comprised of 96 available records (0-95) 920 and 4 records held in reserve in the so-called slack space 820, i.e., records (96-99). In the normal course of operation, only the 96 available records 920 are used and the 4 slack records 820 are held in reserve. At a point in time when Log 10 302 reaches capacity, instead of initiating roll-over, as described above, the newest record is written as the first record of the slack space 820. In other words, when a new record arrives, i.e., record 97, this new record does not overwrite location 0 in accordance with the roll-over process, but is instead written to the first position of the slack space 820, record position 96. This is shown in FIG. 8b.

Referring now to FIG. 8b, considering that Log 10 302 is made up of a total of 96 records and must remain at 96 records, the oldest record pointer is incremented from record position 0 to record position 1 and the newest record pointer is updated to point to record 96 to maintain a total of 96 records. Further, as a consequence of updating the pointers, record position 0 becomes the newest member of the slack space 820 and record position 95 is removed from the slack space 820 and incorporated into the available space 920.

It is appreciated that by virtue of modifying both the lower and upper pointer positions, the sizes of the available space 920 and the slack space 820 remain unchanged. However, what is changed is that the available space 920, previously defined as being inclusive of records 0-95 is now inclusive of records 1-96 and the slack space, previously defined as being inclusive of records 96-99 is now inclusive of records {97, 98, 99, 0}.

II. External Client Download Request

Referring now to FIG. 8c, there is shown the case where a PC client 100 attempt to download Log 10 302. When this occurs, the Log 10 302 is said to be frozen in the sense that the lower record pointer remain fixed (i.e., frozen) for the duration of the download. In the example shown, the "oldest record" pointer is frozen at record position 1 and the "newest record" pointer is free to be incremented as new records are logged to Log 10 302. It should be understood, however, that while the "newest record" pointer is free to be incremented as new records are received, the download state differs from normal operation state in that the "oldest record" pointer does not track the movement of the "newest record" pointer so as to provide an anchor or starting point for the records to be downloaded to the PC client 100 during a download. That is, during download, the records starting with the record currently pointed to by the "oldest record" pointer, e.g., records 1 to 96 are downloaded to the client. During each download, a PC client 100 always receives the number of records defined by the available space 920, which in the present example represents 96 records. These records included in the download are not subject to overwrite or corruption from newly records written to the Log 10 302 during the download.

During the downloading process, the newly written records are written to the slack space 820. However, it is understood that the slack space 820 may not be able to accommodate all of the newly written records. In other words, an out of memory condition occurs, in which case Log 10 302 goes into a Paused State in which it does not accept any additional records. In the Paused State these additional records are discarded by Log 10 302 until such time as the downloading process is discontinued. This is shown in FIG. 8d which illustrates Log 10 302 filled to capacity, i.e., the slack space is filled and logging is discontinued.

Figures 8D, 8E:
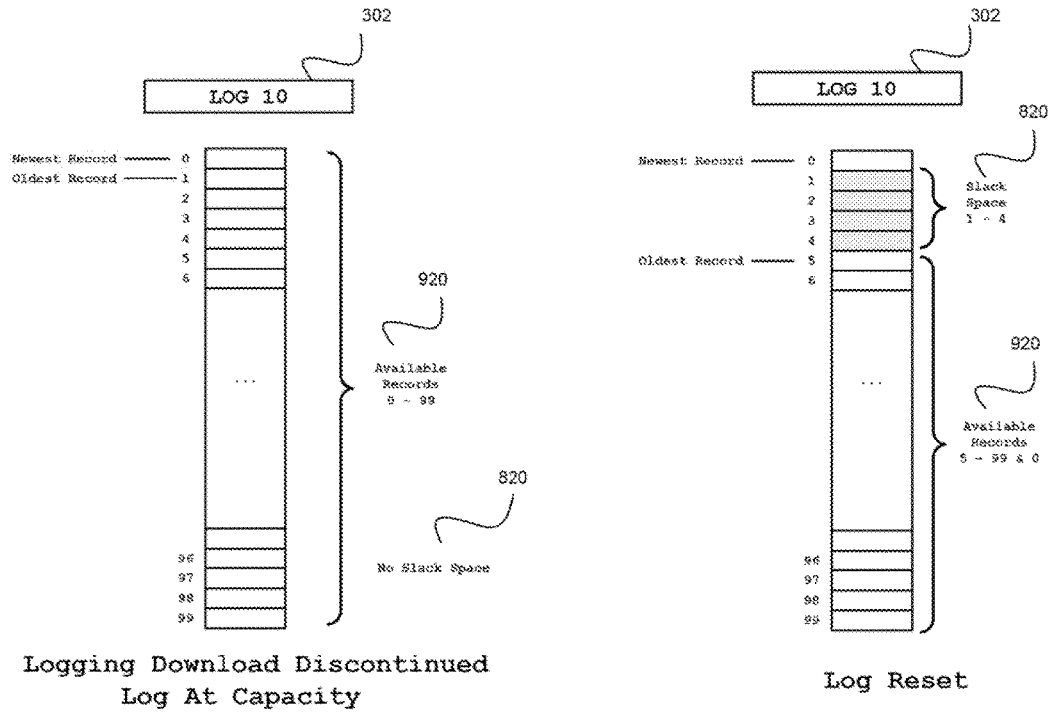
FIG. 8D illustrates another exemplary configuration of an internal Log according to one embodiment.
FIG. 8E illustrates another exemplary configuration of an internal Log according to one embodiment.

Referring now to FIG. 8e, there is shown a reset state of Log 10 302. In the reset state, the "oldest record" pointer is realigned to re-acquire the slack space of 4 records. In the example, the "oldest record" pointer is realigned to point to record 5, which essentially re-acquires a slack space inclusive of records 1-4. In this manner, the available space is realigned by default to include 96 records once more, i.e. records 5-99 and record 0.

IX Non-Volatile Memory

Non-volatile memory may include any one or more of a conventional magnetic disk (e.g., hard disk), an optical disk (e.g., CD-ROM (compact disk-read only memory), DVD (digital video/versatile disc) based storage), magneto-optical (MO) storage, semiconductor-based storage (e.g., flash), etc.

X Firmware and Programmable Settings

Firmware, the program used by the IED to operate and Programmable Settings, the settings that are user configurable by a user are initialized from the non-volatile memory 137 (i.e., compact flash drive) at bootup, when the IED powers up or comes back from a reset. These files can be replaced via the FTP interface and the power meter reset, which allows the user to upgrade the firmware or programmable settings of many meters at once, using a FTP client that supports batch uploading.

In one embodiment, the firmware can be stored on the compact flash. Then the IED can utilize a double buffering technique in which the older firmware is utilized to accept the newer firmware into a new section of the compact flash utilizing the above approach. At the time, the older firmware will copy its newer firmware into the older firmware flash location thus upgrading the IED. This is allowable because the older firmware is loaded to volatile RAM at some point from power up so that the processor utilizes the firmware in volatile RAM thus allowing the older firmware to be re-written by the newer firmware. It should be noted that this technique can also be accomplished utilizing bootloader firmware that is dedicated for upgrading the run-time firmware also. The bootloader can be located in the compact flash or other types of non-volatile storage such as NVRAM, FLASH and other forms as described in this application.

XI Firmware

The firmware file contains the firmware image, plus additional information such as a checksum and comments.

The firmware files are preferably stored in non-volatile memory (compact flash 137) and are loaded on bootup of the IED from the compact flash 137. The IED provides capabilities for updating the firmware files stored in the compact flash 137 via the FTP interface. For example, some non-limiting examples of firmware that may be upgraded in this manner include, Comm Run firmware, upgradeable by replacing a file (Module A), FPGA firmware, upgradeable by replacing a file (Module C) and DSP2 firmware, upgradeable by replacing a file (Module D).

XII Programmable Settings

The Programmable Settings of the IED 10 are preferably stored in non-volatile memory (compact flash 137). It contains all of the configuration information for the IED To update the programmable settings, the file is overwritten, and the meter is reset. The meter then initializes its configuration from this file on boot.

XIII Data Security

The original FTP specification is an inherently insecure method of transferring files because there is no method specified for transferring data in an encrypted fashion. This means that under most network configurations, user names, passwords, FTP commands and transferred files can be "sniffed" or viewed by anyone on the same network using a packet sniffer. This is a problem common to many Internet protocol specifications written prior to the creation of SSL such as HTTP, SMTP and Telnet. The common solution to this problem is to use simple password protection or simple encryption schemes, or more sophisticated approaches using either SFTP (SSH File Transfer Protocol), or FTPS (FTP over SSL), which adds SSL or TLS encryption to FTP as specified in RFC 4217. The inventors have contemplated the use of each of these schemes in the IED 130, described as follows.

In one embodiment, the FTP server 131 in the IED 130 uses a set of username and passwords which are programmed through Modbus. These username and passwords can only be programmed when a user performs a logon with administrative rights. Each programmed user account can be given differing permissions, which grant or restrict access to different roles within the file system. Each role controls read and write access to specific files and directories within the file system through FTP. These roles can be combined to customize the access a specific user is given. When passwords are disabled by the user, a default user account is used, with full permissions, and a username and password of "anonymous".

Password protection schemes are measured in terms of their password strength which may be defined as the amount of resiliency a password provides against password attacks. Password strength can be measured in bits of entropy. Password strength is an important component of an overall security posture, but as with any component of security, it is not sufficient in itself. Strong passwords can still be exploited by insider attacks, phishing, keystroke login, social engineering, dumpster diving, or systems with vulnerabilities that allow attackers in without passwords. To overcome these drawbacks it is contemplated to use some form of password encryption scheme (e.g., 8-bit, 10-bit, 16-bit) in concert with the password protection system to facilitate secure communication between a PC client 100 and the FTP server 131. However, there are drawbacks associated even with these schemes. For example, a username and password may be encoded as a sequence of base-64 characters. For example, the user name Aladdin and password open sesame would be combined as Aladdin:open sesame which is equivalent to QWxhZGRpbjpvcGVuIHNlc2FtZQ== when encoded in base-64. Little effort is required to translate the encoded string back into the user name and password, and many popular security tools will decode the strings "on the fly", so an encrypted connection should always be used to prevent interception.

In another embodiment, an encrypted connection scheme is used. In particular, the FTP server 131 in the IED 130 uses some form of FTP security encryption, such as, for example, FTPS (FTP over SSL), Secure FTP (sometimes referred to as FTP over SSH, i.e., FTP over Secure Shell encryption (SSH)), Simple File Transfer Protocol (SFTP), or SSH file transfer protocol (SFTP). These FTP security encryption protocols provide a level of security unattainable with the previously described password encryption schemes.

FTP over SSH refers to the practice of tunneling a normal FTP session over an SSH connection. Because FTP uses multiple TCP connections, it is particularly difficult to tunnel over SSH. With many SSH clients, attempting to set up a tunnel for the control channel (the initial client-to-server connection on port 21) will protect only that channel; when data is transferred, the FTP software at either end will set up new TCP connections (data channels) which will bypass the SSH connection, and thus have no confidentiality, integrity protection, etc. If the FTP client, e.g., PC client 100, is configured to use passive mode and to connect to a SOCKS server interface that many SSH clients can present for tunneling, it is possible to run all the FTP channels over the SSH connection. Otherwise, it is necessary for the SSH client software to have specific knowledge of the FTP protocol, and monitor and rewrite FTP control channel messages and autonomously open new forwardings for FTP data channels.

While preferred embodiments are disclosed herein, many variations are possible which remain within the concept and scope of the present disclosure. Such variations would become clear to one of ordinary skill in the art after inspection of the specification, drawings and claims herein. The present disclosure therefore is not to be restricted except within the spirit and scope of the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning Finally, unless a claim element is defined by reciting the word "means" and a function without the recital of any structure, it is not intended that the scope of any claim element be interpreted based on the application of 35 U.S.C. § 112, sixth paragraph.

What is claimed is:

1. An intelligent electronic device (IED) configured to monitor and determine power usage of a load within a power distribution system, the IED comprising:
 a plurality of sensors coupled to a plurality of phases of the power distribution system, the plurality of sensors configured to sense electrical parameters of the power distributed by the power distribution system to the load;

at least one memory device including a storage file system configured to store data logs representing the sensed electrical parameters in the at least one memory device, each of the data logs including at least one log file, the storage file system having a single directory, each of the data logs stored in the single directory, wherein the storage file system is further configured such that the total number of log files is fixed, each of the log files is of a fixed size, and the log files are stored adjacent to each other in the at least one memory device, such that, during normal operation, the log files are never deleted and new log files are never created to guarantee the log files remain adjacent to each other within the at least one memory device; and at least one processor configured to operate as a File Transfer Protocol (FTP) server to provide access to the storage file system via a first communication device;

wherein the at least one processor performs a file transfer operation in accordance with the FTP protocol to transfer the data logs as a stream of data blocks via a network to a client system, the fixed size of each log file being configured to a predetermined minimum size to optimize the performance of the file transfer operation;

wherein the at least one processor is configured to receive at least one virtual command file via an FTP communication from the client system, the at least one virtual command file is packaged as a file name to be accessed on the storage file system, the at least one processor configured to open the at least one virtual command file and perform an action on the IED, the action performed by the at least one processor as a function of the file name to be accessed.

2. The IED of claim 1, wherein the at least one processor performs the file transfer operation in response to receiving a transfer request from the client system.

3. The IED of claim 2, wherein the client system is configured to automatically send the transfer request on a periodic basis.

4. The IED of claim 1, wherein the at least one processor initiates the file transfer operation.

5. The IED of claim 1, wherein the file transfer operation includes only two handshaking operations between the IED and the client system, wherein a first handshaking operation occurs before the data logs are transferred and a second handshaking operation occurs after the data logs are transferred.

6. The IED of claim 5, wherein the at least one processor transfers each block of the stream of data blocks without waiting for a response from the client system between transferred blocks.

7. The IED of claim 1, wherein the at least one memory device is a flash memory configured to store the data logs.

8. The IED of claim 7, wherein the flash memory is removably connected to the IED.

9. The IED of claim 1, wherein the client system comprises a log retrieval system configured to poll the IED to obtain feedback data concerning the current state of entries in the data logs stored in the storage file system of the IED, retrieve IED identification information from the IED, utilize a first portion of the IED identification information to determine features that are supported by a version of firmware of the IED, utilize a second portion of the IED identification information to create a log storage directory in which to store the data logs, retrieve a programmable settings file from the IED, and use the programmable settings file to calculate a file mapping of each data log stored in the storage file system of the IED.

10. The IED of claim 1, wherein the storage file system is configured to be compatible with FAT32 file systems.

11. The IED of claim 10, wherein the data logs are stored using a format in which the filename includes up to eight characters and the extension includes three characters.

12. The IED of claim 1, wherein the at least one FTP command is at least one of access to a log file, a reading of log file and/or a reset.

13. The IED of claim 1, wherein the at least one processor extracts parameters associated with the at least one action from the file name.

14. The IED of claim 1, wherein the file to be accessed does not exist on the storage file system.

15. The IED of claim 1, wherein at least one field of a communication protocol other than FTP is embedded in the name of the file to be accessed in the at least one virtual command file.

16. An intelligent electronic device (IED) configured to monitor and determine power usage of a load within a power distribution system, the IED comprising:

a plurality of sensors coupled to a plurality of phases of the power distribution system, the plurality of sensors configured to sense electrical parameters of the power distributed by the power distribution system to the load;

a storage file system configured to store data logs representing the sensed electrical parameters; and at least one processor configured to operate as a File Transfer Protocol (FTP) server to provide access to the storage file system via a first communication device, the at least one processor performs a file transfer operation in accordance with the FTP protocol to transfer the data logs via a network to a client system, wherein, in response to a polling request from the client system, the at least one processor transfers feedback data concerning the current state of entries in the data logs stored in the storage file system, IED identification information including a first portion utilized to determine features that are supported by a version of firmware of the IED and a second portion utilized to create a log storage directory in the client system in which to store the data logs, and a programmable settings file used to calculate a file mapping of each data log stored in the storage file system of the IED.

17. The IED of claim 16, wherein the file transfer operation includes a first handshaking operation which occurs before the data logs are transferred and a second handshaking operation which occurs after the data logs are transferred.

18. The IED of claim 16, wherein the storage file system is configured to be compatible with a FAT32 file system.

19. The IED of claim 16, wherein the storage file system further includes a plurality of log header files, each log header file being associated with one of the data logs in a one-to-one relationship, each log header file including statistics on each of the data logs.

20. The IED of claim 16, wherein the data logs are allocated in the at least one memory device during a low level formatting operation of the at least one memory device.

21. The IED of claim 16, wherein each data log includes at least one log file and each log file includes one or more records and the one or more records within each log file are written to in a circular wrap-around style format.

22. The IED of claim 21, wherein each log file includes one or more records and the size of the records in a given log file and the total number of records in a given log file are each fixed to optimize the performance of the file transfer operation.

23. The IED of claim 21, wherein each log file is configured as a circular buffer such that when a given log file becomes full, the oldest data in the given log file is overwritten with the new data to guarantee the log files remain adjacent to each other within the at least one memory device.

24. The IED of claim 16, wherein the at least one processor is configured to operate as a database server for a plurality of external IEDs, and wherein the storage file system is configured to store data logs transferred according to the FTP protocol from the plurality of external IEDs.

25. The IED of claim 16, wherein, during the file transfer operation, the at least one processor transfers the data logs as a stream of data blocks via the network to the client system.

* * * * *